US008374284B2

(12) United States Patent
Watson

(10) Patent No.: US 8,374,284 B2
(45) Date of Patent: Feb. 12, 2013

(54) UNIVERSAL DECODER

(75) Inventor: Mark Watson, London (GB)

(73) Assignee: Apple, Inc., Cupertino, CA (US)

( * ) Notice: Subject to any disclaimer, the term of this patent is extended or adjusted under 35 U.S.C. 154(b) by 2391 days.

(21) Appl. No.: 11/018,227

(22) Filed: Dec. 21, 2004

(65) Prior Publication Data

US 2005/0180459 A1 Aug. 18, 2005

Related U.S. Application Data

(60) Provisional application No. 60/543,967, filed on Feb. 12, 2004.

(51) Int. Cl.
*H04L 27/00* (2006.01)

(52) U.S. Cl. ........ 375/316; 375/346; 714/774; 714/752; 714/753; 714/754; 714/755; 714/758; 714/759; 714/762; 714/763; 714/764; 714/766; 714/768; 714/786

(58) Field of Classification Search .................. 375/316
See application file for complete search history.

(56) References Cited

U.S. PATENT DOCUMENTS

| | | | | |
|---|---|---|---|---|
| 5,634,070 | A * | 5/1997 | Robinson | 712/28 |
| 6,065,147 | A * | 5/2000 | Pyndiah et al. | 714/755 |
| 6,145,110 | A * | 11/2000 | Khayrallah | 714/752 |
| 6,334,218 | B1 * | 12/2001 | Jeong et al. | 725/72 |
| 6,724,737 | B1 * | 4/2004 | Boyden et al. | 370/316 |
| 6,771,824 | B1 * | 8/2004 | Chiu et al. | 382/233 |
| 6,856,263 | B2 * | 2/2005 | Shokrollahi et al. | 341/50 |
| 7,006,574 | B2 * | 2/2006 | Ueda et al. | 375/240.25 |
| 7,213,143 | B1 | 5/2007 | Watson et al. | |
| 7,213,197 | B2 * | 5/2007 | Jacobsen et al. | 714/800 |
| 7,240,120 | B2 * | 7/2007 | Frantz et al. | 709/231 |
| 7,246,166 | B1 | 7/2007 | Watson | |
| 7,296,208 | B2 * | 11/2007 | Sun et al. | 714/752 |
| 7,746,849 | B2 | 6/2010 | Bodin et al. | |
| 7,826,384 | B2 | 11/2010 | Scoggins et al. | |
| 7,961,714 | B1 | 6/2011 | Watson et al. | |
| 8,213,418 | B2 | 7/2012 | Watson et al. | |
| 2002/0138537 | A1 * | 9/2002 | Forrest et al. | 708/620 |
| 2002/0154712 | A1 * | 10/2002 | Cideciyan et al. | 375/341 |
| 2002/0184040 | A1 * | 12/2002 | Okano | 704/500 |
| 2003/0066014 | A1 * | 4/2003 | Van Dijk et al. | 714/774 |
| 2003/0104788 | A1 * | 6/2003 | Kim | 455/67.3 |
| 2004/0037500 | A1 * | 2/2004 | Yoo | 385/31 |
| 2004/0098659 | A1 * | 5/2004 | Bjerke et al. | 714/776 |
| 2007/0256001 | A1 * | 11/2007 | Suzuki et al. | 714/774 |

* cited by examiner

*Primary Examiner* — Siu Lee

(74) *Attorney, Agent, or Firm* — Meyertons, Hood, Kivlin, Kowert & Goetzel, P.C.; Eric B. Meyertons

(57) ABSTRACT

The invention is directed to a method and apparatus for decoding encoded data symbols. The invention is also directed to corresponding encoding methods. The decoder arrangement comprises an input for receiving encoded data and an identifier associated with a coding scheme used to create said encoded data. A processor in the decoding arrangement determines from the identifier, a mapping between said encoded data and the original data. A decoder uses the mapping to extract the original data from the encoded data. The operation of the decoder is independent of the coding scheme used in the encoding process.

38 Claims, 3 Drawing Sheets

UNIVERSAL DECODER

This application claims the benefit of provisional application Ser. No. 60/543,967, filed Feb. 12, 2004, the disclosures of which is incorporated herein by reference in its entirety. This application also claims the benefit of Great Britian application Ser. No. 0420456.6, filed Sep. 15, 2004, the disclosures of which is incorporated herein by reference in its entirety.

FIELD OF THE INVENTION

This invention relates to methods and apparatus for decoding data symbols for use in packet data communications systems. The invention also relates to a corresponding encoder and method of transmitting data symbols to a decoder.

COPYRIGHT NOTICE

A portion of the disclosure of this patent contains material which is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

BACKGROUND TO THE INVENTION

In a packet data communications system, for example the internet or a radio packet service (e.g. GPRS, General Packet Radio Service), packets may be lost between the sending node in the system and the receiving node in the system. According to the quality of the channel, a differing proportion of the packets may be lost, such proportion varying over time according to various factors. In order for the data to be transmitted successfully, the lost packets will need to be recovered in some way by the receiving node. This is often achieved by the receiving node acknowledging the packets received such that the sending node can determine which packets have been received and selectively retransmit the lost packets. A system which requires little retransmission of packets is more efficient than a network which requires considerable retransmission of packets.

Multicast data distribution over packet networks has been proposed and this means that the sending node in the network is now sending the same data to many receiving nodes. There may in some circumstances be hundreds or thousands of receiving nodes, for example in a packet network sending football scores to the mobile phones belonging to all those located in a football stadium. When sending to many receiving nodes, the loss properties of the link (or channel) between the sending node and each receiving node will vary significantly. The actual data which is lost will also vary between receivers (i.e. if all receiving nodes receive 8 out of 10 packets sent, each node will not receive the same 8 packets). In such a network it is not practical for each received packet to be acknowledged by each of the receiving nodes as this would create a huge overhead in signalling. Instead forward error correction (FEC) techniques are used to ensure that each receiving node has a high probability of recovering the original data from the packets received, even though each receiving node may have received different parts of the encoded data stream.

A number of FEC schemes are known and in order for a receiving node to be able to extract the data from the received signal, the receiving node must know the FEC scheme which is being used. The step of extraction of the data from the received information which is FEC coded (i.e. the decoding step) requires a lot of processing. In order that this decoding can be done in a realistic time, it is usual to develop specialised decoding software for the particular scheme to be employed.

One class of forwards error correction techniques that is known is Low Density Parity Check techniques.

OBJECT TO THE INVENTION

The invention seeks to provide a decoder arrangement which mitigates at least one of the problems of known methods.

SUMMARY OF THE INVENTION

According to a first aspect of the invention there is provided a decoder arrangement for use in a packet communications system comprising: an input for receiving both encoded data and information associated with a coding scheme used to create said encoded data; a processor for determining on the basis of said information, a mapping between said encoded data and decoded data; and a decoder for extracting data from said encoded data based on said mapping.

An advantage of such a decoder arrangement is that the operation of the decoder within the arrangement performs the same set of operations independent of the coding scheme; that is, the decoder can be said to be universal. For example, the processor develops the mapping, which may be a graph or matrix and then the decoder performs the decoding of the data based on this mapping provided by the processor, which may be by executing an algorithm. The algorithm will be independent of the mapping (e.g. matrix/graph) and it is this mapping which will be different for different coding schemes.

An advantage of such a decoder arrangement is that the coding scheme to be used does not have to be decided in order to develop and deploy the decoding systems. In large scale multicast applications, the decoding systems will be widely distributed and likely not under direct control of the sending system owner once initially deployed, for example the decoding systems may be integrated into 3rd Generation mobile handsets. As a result of using such a decoder arrangement, the decision on which coding scheme to use can be made at a later time, when the requirements and real-world characteristics of the channels between sender and receivers are better understood (e.g. through practical experience).

The information may comprise an identifier associated with said coding scheme and wherein said identifier is one of a program, an address at which a program can be accessed and an identifier for a previously received program.

The information may comprise: an identifier associated with said coding scheme; information associated with a stream of said encoded data; and information associated with each packet within said encoded data.

The mapping may comprise a matrix representation and the decoder may be for solving said matrix representation.

The step of solving said matrix representation may comprise the steps of: determining a density of the matrix representation; and solving the matrix representation using a matrix manipulation technique adapted according to said density determination.

The matrix manipulation may comprise a Gaussian elimination process and wherein if said density is below a predetermined threshold said Gaussian elimination process comprises the steps of:

calculating the weight of rows within the matrix; selecting a row of minimum weight as pivot row; selecting a column of minimum weight as pivot column from those columns which have an entry in the selected pivot row and whose value is not known; calculating the sum of symbols referenced by said pivot row whose value is already known; adding said sum to the symbol associated with each row which has an entry in the selected pivot column; and determining if the matrix contains more than a minimum number of rows required to complete Gaussian elimination, and if so, identifying rows of highest density and only performing said step of adding for each of said row of highest density when it is selected as a pivot row; and wherein if said density is above a predetermined threshold said Gaussian elimination process comprises the steps of: performing Gaussian elimination; and deferring symbol calculations until the Gaussian elimination process is complete.

The coding scheme may be a forward error correction scheme and the forward error correction scheme may be a low density parity check erasure code.

The decoder may be arranged to operate in the same manner independent of the coding scheme used.

An advantage of such a universal decoder is that the coding scheme to be used can be changed without the need to upgrade the receiving systems. This may be beneficial where new coding schemes are developed which provide improved efficiency.

The decoder arrangement may be for use on an erasure channel in said packet communications system.

The decoder arrangement may be for use in multicast data distribution.

The processor may be implemented in software.

The processor may be a Virtual Machine.

The identifier may be an executable program.

According to a second aspect of the invention there is provided an encoder for use in a packet communications system comprising: an input for receiving data; a processor for coding said data into encoded data using a coding scheme; and an output for transmitting said encoded data and information associated with said coding scheme.

The information may comprise an identifier associated with said coding scheme and wherein said identifier is one of a program, an address at which a program can be accessed and an identifier for a previously transmitted program.

The information may comprise: an identifier associated with said coding scheme; information associated with a stream of said encoded data; and information associated with each packet within said encoded data.

The coding scheme may be a forward error correction scheme and the forward error correction scheme may be a low density parity check erasure code.

The encoder may be for use on an erasure channel in said packet communications system.

The encoder may be for use in multicast data distribution.

According to a third aspect of the invention there is provided a signal for transmission across a channel in a network which has losses, said signal comprising: data encoded according to a coding scheme; and an identifier associated with said coding scheme.

The signal may further comprise: information associated with a data stream; and information associated with each packet in said data stream.

The identifier may be one of a program, an address at which a program can be accessed and an identifier for a previously transmitted program.

The coding scheme may be a forward error correction scheme and the forward error correction scheme may be a low density parity check erasure code.

According to a fourth aspect of the invention there is provided a method of decoding data symbols comprising the steps of: receiving information associated with a coding scheme used to create said symbols from a data stream; receiving said symbols; determining from said identifier a mapping between said symbols and said data stream; and extracting said data stream from the symbols according to said mapping.

The information may comprise an identifier associated with said coding scheme and said identifier is one of a program, an address at which a program can be accessed and an identifier for a previously received program.

The information may comprise: an identifier associated with said coding scheme; information associated with said data stream; and information associated with each packet within said data stream.

The mapping may comprise a matrix representation and said step of extracting may comprise solving said matrix representation.

The coding scheme may be a forward error correction scheme and the forward error correction scheme may be a low density parity check erasure code.

The extracting step may be independent of said coding scheme.

The information may be a computer program and said determining step may comprise the step of: running said program.

The information may comprise an identifier associated with a computer program, and said determining step may comprise running said program.

The information may comprise an address at which a program can be accessed, and said determining step may further comprise the steps of: accessing said program at said address; and running said program.

According to a fifth aspect of the invention there is provided a method of receiving encoded data from a network comprising the steps of: receiving a signal comprising encoded data and information associated with a coding scheme used to create said encoded data; determining on the basis of said information, a mapping between said encoded data and decoded data; and extracting said decoded data from said encoded data according to said mapping.

The information may comprise: an identifier associated with said coding scheme; information associated with a data stream; and information associated with each packet in said data stream.

According to a sixth aspect of the invention there is provided a method of transmitting encoded data across a network, comprising the steps of: encoding said data using a coding scheme; transmitting said encoded data; and transmitting information associated with said coding scheme.

The information may comprise: an identifier associated with said coding scheme and wherein said identifier is one of a program, an address at which a program can be accessed and an identifier for a previously received program.

The information may comprise: an identifier associated with said coding scheme; information associated with a stream of said encoded data; and information associated with each packet within said encoded data.

The method may be performed by software in machine readable form on a storage medium.

It is acknowledged that software can be a valuable, separately tradable commodity. The term 'software' is intended to encompass software, which runs on or controls "dumb" or standard hardware, to carry out the desired functions, (and therefore the software essentially defines the functions of the decoder/encoder, and can therefore be termed a decoder/ encoder, even before it is combined with its standard hardware). For similar reasons, it is also intended to encompass software which "describes" or defines the configuration of hardware, such as HDL (hardware description language) software, as is used for designing silicon chips, or for configuring universal programmable chips, to carry out desired functions.

According to a seventh aspect of the present invention, there is provided a computer program arranged to perform a method of decoding data symbols comprising the steps of: receiving information associated with a coding scheme used to create said symbols from a data stream; receiving said symbols; determining from said identifier a mapping between said symbols and said data stream; and extracting said data stream from the symbols according to said mapping.

The preferred features may be combined as appropriate, as would be apparent to a skilled person, and may be combined with any of the aspects of the invention.

BRIEF DESCRIPTION OF THE DRAWINGS

An embodiment of the invention will now be described with reference to the accompanying drawings in which.

DETAILED DESCRIPTION OF INVENTION

Figure 1:
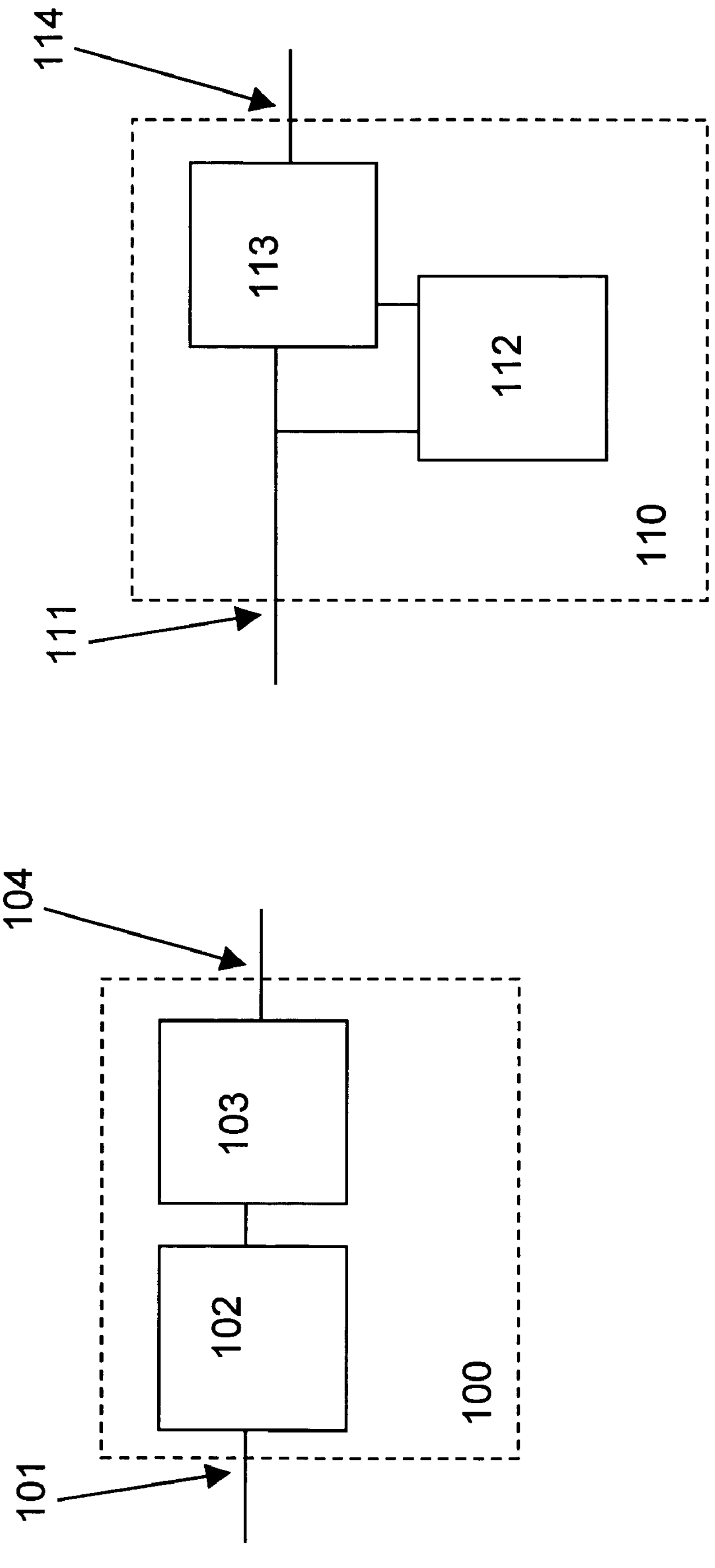
FIG. 1 is a schematic diagram of an encoder and a decoder arrangement.

Embodiments of the present invention are described below by way of example only. These examples represent the best ways of putting the invention into practice that are currently known to the Applicant although they are not the only ways in which this could be achieved.

A channel within a packet data network which suffers from lost packets and where the receiving node knows which packets have been received and which have been lost is known as an erasure channel (i.e. the location of errors is known). A class of FEC codes has been developed called Low Density Parity Check (LDPC) erasure codes. These codes operate over large blocks of data. In fact a number of well-known forward error correction codes for various types of channels can be represented as generalised LDPC codes, (e.g. Turbo and Convolutional codes used for Gaussian channels and Tornado and Raptor codes used for erasure channels).

A universal decoder is described here with relation to LDPC codes and erasure channels. However this is by way of example only and the methods and apparatus described are not limited to use with LDPC codes or erasure channels. In fact the decoder described can successfully be used with the well-known Reed-Solomon erasure codes based on Cauchy or Vandermonde matrices. This technique may be preferred in some situations, but since these are not Low Density codes, the performance may not be optimal in terms of matrix storage and manipulation unless adaptive storage and manipulation techniques are employed.

The principle of the universal decoder is that the details of the particular scheme (i.e. the precise code) to be used are not designed into the decoder. Instead, the details are communicated to the decoder and these details are interpreted and used at the decoder to control the decoding operation. The decoding operation can be controlled in many ways, including but not limited to, providing a decoding map to enable decoding of a stream of data and possibly also providing instructions (which may be on a step by step basis) to control the high-level operation of the decoder e.g. providing instructions on the order of decoding operations and details of which data should be processed at which step.

The details of the particular scheme may be provided to the decoder arrangement in the form of a small computer program. The program may be sent from the sending node to the receiving node directly, or the sending node may send an address, such as a url, (universal resource locator), which enables the receiving node to fetch the computer program. A label identifying the scheme or program may be sent with the address such that the receiving node can determine whether it has already retrieved the required program or whether it needs to fetch it from the address provided.

The computer program which contains the details of the scheme to be used may be communicated in the form of a bytecode, (or executable program) which is directly interpreted within a 'Virtual Machine' at the decoder. This bytecode and Virtual Machine may be specifically designed and optimised for the task of expressing the details of a LDPC scheme. The term 'Virtual Machine' is used herein to refer to a microprocessor which is implemented in software.

The program encapsulates the details of the LDPC scheme used. This enables the actual decoding operation to be performed by a decoder which is independent of the scheme used and which can then be optimised for the platform.

Use of a bytecode and Virtual Machine is only one possible implementation which is described herein by way of example. Other means of identifying the LDPC schemes used and generating the required inputs for the decoder are also possible, including but not limited to use of a Java program, or a set of parameters for an algorithmic process which defines the LDPC scheme.

A schematic diagram of an encoder 100 and a decoder arrangement 110 is shown in FIG. 1. Although the diagram shows separate functional entities within each of the encoder and decoder arrangement, these entities may be separate or integrated (integration may be of some or all of the entities).

The encoder 100 has an input 101 to receive a stream of data. The data is input to a source symbol generator 102 and the source symbols are fed to an encoding symbol generator 103. The generated encoding symbols are fed to transmitting equipment via output 104. The encoder also outputs an identifier associated with the way in which the source symbols are encoded in the encoding symbol generator. The encoder may also output information associated with the stream of data (also referred to as 'Object information') and information associated with each packet within the stream (also referred to as 'packet information'). The identifier may be one of a program, an address at which a program can be accessed and an identifier for a previously received/accessed program.

The decoder arrangement 110 has an input 111 to receive the encoding symbols and other transmitted information (e.g. identifier and/or object information and/or packet information). The program/identifier along with any object and/or packet information received is fed to a processor 112, which may be implemented in software and which determines a mapping between the encoding symbols and provides this mapping to a universal decoder 113. The decoder uses the mapping to combine the encoding symbols received and then outputs the data via output 114.

Instructions may be provided to the decoder from the processor on a regular basis (e.g. step by step, per group of steps, per matrix or per sub-matrix) or they may be provided less frequently, allowing the decoder to operate autonomously between receipt of instructions. The processor will also determine whether the decoder should commence decoding once the first symbol has arrived or whether it should wait for the arrival of a predetermined number of symbols. Instructions on starting the decoding process will be provided to the decoder from the processor. Additionally, the processor may determine how to handle symbols which arrive whilst the decoder is actively decoding symbols which had arrived previously.

The encoder may be a universal encoder, having an encoding symbol generator comprising a processor, which may be a Virtual Machine and this may be the same Virtual Machine as is described here for use in the decoder. The encoding symbol generator also comprises an encoder which performs the encoding having been provided a mapping (or instructions) by the processor. The encoder is therefore universal as the details of the coding scheme to be used are not built into the encoding function. The encoder may use a modified version of an algorithm used by the decoder and such modifications are described below in relation to the first example of a decoding algorithm. Although a universal encoder may not, in general, be more efficient than a code-specific encoder, it is more flexible and allows the rapid introduction of new codes. Such an encoder could be subsequently replaced by a code-specific encoder once the final code selection has been made for a particular application.

LDPC codes and the universal decoder are described in more detail below.

LDPC codes are constructed by dividing the data to be sent into blocks, called source symbols. In many cases, these blocks are chosen to be equal in size to the chosen packet size for packets to be sent across the communications system (for example 512 bytes), but they could equally be smaller and several blocks could be sent within a single packet.

The encoder uses these source symbols to generate encoding symbols (of the same size). Each encoding symbol is constructed by applying a combination operation over one or more of the source symbols (where only one source symbol is involved, the encoding symbol is obviously equal to the source symbol). In the case of symbols which consist of binary digits, the combination operation may be a bitwise exclusive OR operation. Encoding symbols formed from more than one source symbol are also known as parity symbols. It is these encoding symbols which are then sent across the network from the sending node to the receiving node(s).

Different LDPC codes are constructed through different schemes for the choice of source symbols to combine to form each encoding symbol. Different schemes result in widely differing properties in terms of encoding and decoding time and memory requirements, the overhead required to fully construct the original data, the likelihood of failure for a given overhead and the sensitivity of the code to variations in the symbol (packet) loss rate.

Figure 2:
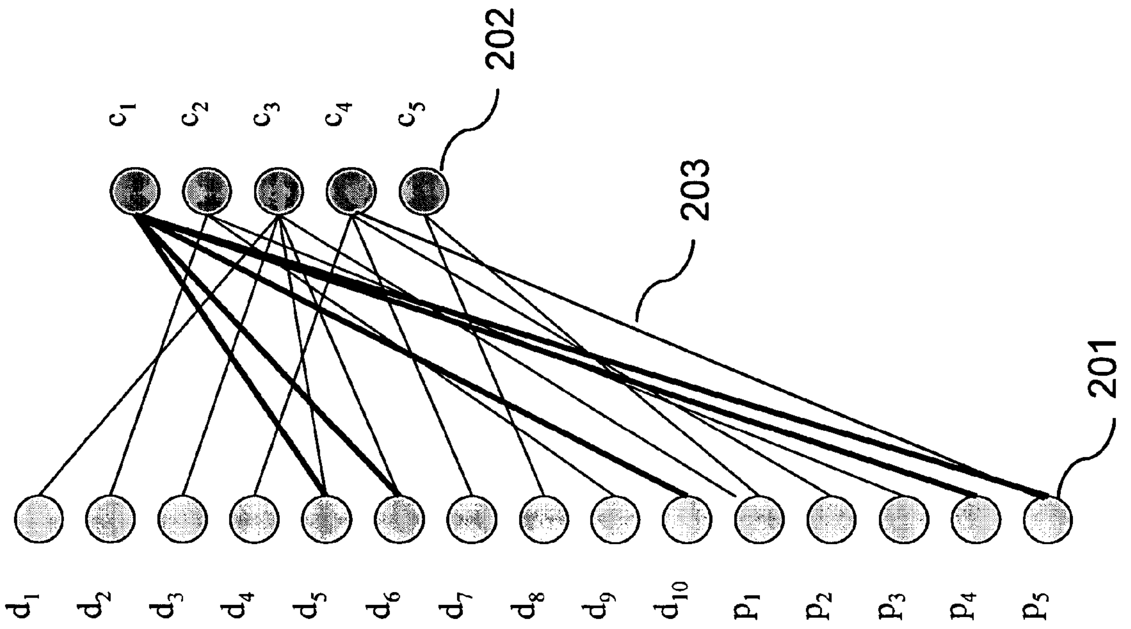
FIG. 2 is a diagram of how a Low Density Parity Check code can be represented in the form of a sparse bipartite graph.

Any LDPC code can be represented in the form of a sparse bipartite graph as shown in FIG. 2. Note that this figure is intended only to describe the manner in which LDPC codes can be represented and does not represent an example of a code that would perform well in practice. The circles on the left 201 are the 'left nodes' and the other set 202 the 'right nodes' or 'constraint nodes'. Each left node represents either a source or a parity symbol. The source symbols are denoted d, and the parity symbols are denoted $p_y$, where x and y are integers.

Each right node is shown in FIG. 2 as connected to one or more left nodes by lines 203. These lines are referred to as 'edges'. Each right node (or constraint node) and the edges it is connected to, represents a linear relationship between the left nodes connected to those edges. Specifically, the combination operation applied to the left nodes connected to any given right node results in zero. In the case of symbols consisting of a number of binary digits, or bits, the combination operation may be the bitwise exclusive OR of the symbols. In FIG. 2, $d_1 \ldots d_{10}$ are the source symbols, $p_1 \ldots p_5$ are the encoding symbols and $C_1 \ldots C_5$ the constraints amongst them. Node $c_1$ is shown having neighbours $d_5$, $d_6$, $d_{10}$, $p_4$ and $p_5$, (edges shown as bold lines) therefore:

$$d5 \oplus d6 \oplus d10 \oplus p4 \oplus p5 = 0$$

where $\oplus$ is the combination operator (exclusive OR).

Figure 3:
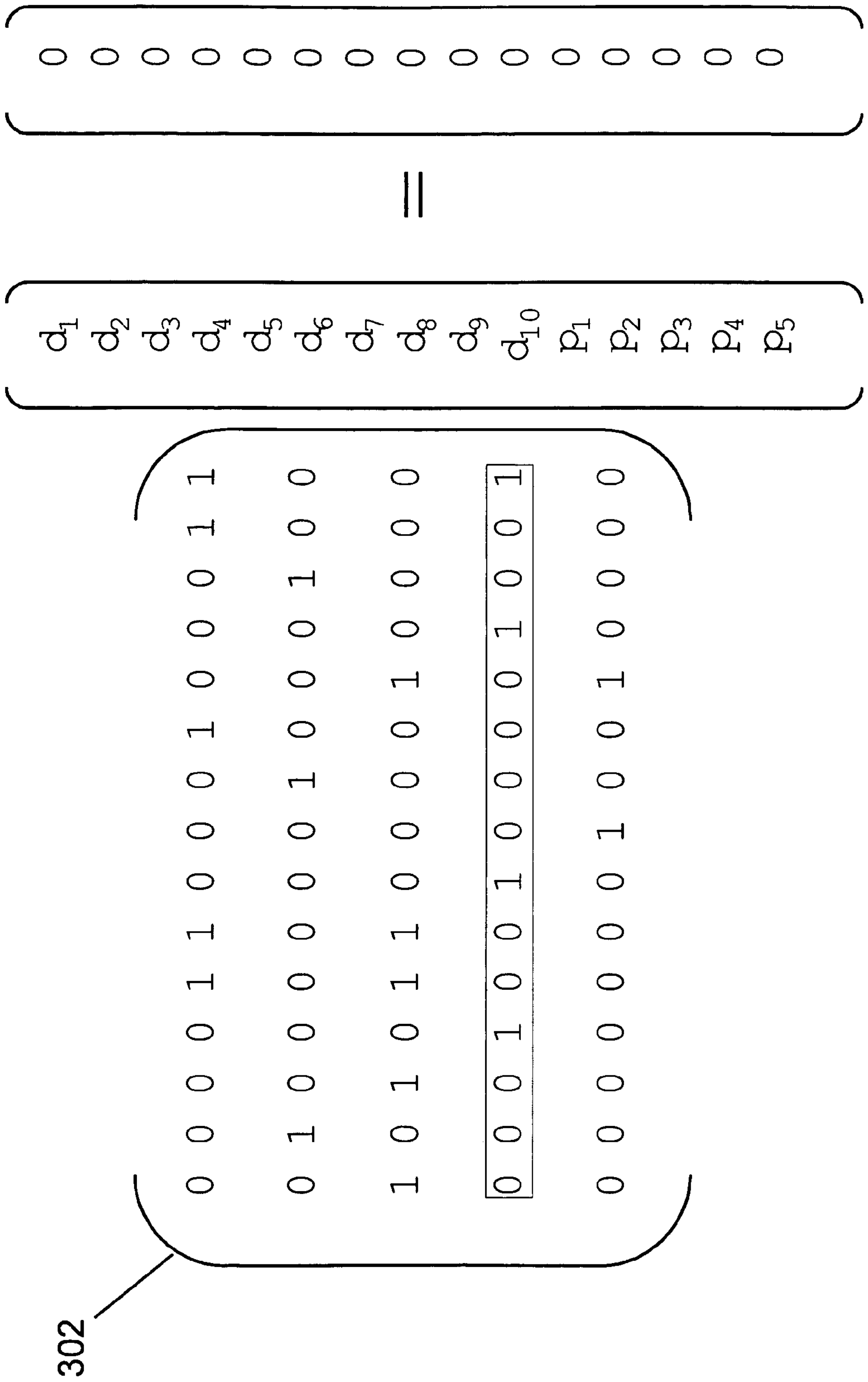
FIG. 3 is a matrix representation of the code shown in FIG. 2.

Equivalently, the LDPC code can be represented by a sparse matrix as shown in FIG. 3. In the matrix representation shown in FIG. 3, known as the 'generalised parity matrix' (identified by 302) for the code, each column represents either a source or a parity symbol ($d_x$ or $p_y$) and each row a constraint ($c_z$). For each row, the sum of the symbols for which a '1' appears in their corresponding column must be zero.

Clearly, the element in row i and column j of the matrix representation has value '1' if and only if there is an edge between the left node 'i' and right node 'j' in the equivalent graph representation.

The same LDPC code can be represented by many different matrices. For example, there is always a representation in which each column corresponding to a parity symbol has only a single non-zero entry. This representation can be used by an encoder to easily generate the parity symbols—specifically each parity symbol is the sum of the source symbols whose columns have a '1' in the same row as the parity symbol has a '1'. In fact it is the task of the encoder to find such a representation. Such a matrix is known as a 'Generator Matrix' for the code.

The representation used by the decoder may be different from this generator matrix. This is particularly the case for schemes which are defined in terms of relationships involving multiple parity symbols. For these schemes the decoding process can be based on the matrix generated according to the scheme definition. The encoder would need to solve this matrix in order to determine how to generate each parity symbol from the source symbols.

It is important if the matrix is large that the representation used by the decoder is Low Density (or Sparse)—i.e. having relatively few entries per row/column—in order to avoid an explosion in the computational complexity of the decoding process. However, the corresponding generator matrix may be 'dense' (i.e. having many entries per row/column). Also, for some codes certain rows in the parity matrix may have very many entries, perhaps even approaching or equal to the number of columns in the matrix. However it is sufficient for the efficiency of the code that these rows are in a minority.

It should be noted that not all parity symbols may be intended to actually be sent over the network. Some of them may be 'intermediate symbols' which although never sent, may be decoded during the decoding process and then prove useful in decoding the actual source symbols.

As noted above, certain of the encoding symbols may be equal to the source symbols. In fact in this generalised representation of the code it is required that at least one encoding symbol is equal to each source symbol. i.e. there is a column in the matrix for each source symbol. However, these symbols may or may not be actually sent over the network. Codes in which these symbols are sent are known as 'systematic'. Without loss of generality, we assume that the first k columns of the matrix represent the k source symbols.

The task of the decoder is to reconstruct the complete set of source symbols given some subset of the encoding symbols (some of which may be equal to source symbols, the others being parity symbols). This is because some of the encoding symbols will have been lost in transmission.

Ideally, if there are k source symbols, we would like to be able to reconstruct them from any k of the encoding symbols. However, unlike codes such as Reed-Solomon, LDPC codes do not have this property. In return, however, they are considerably more computationally efficient, making it viable to apply them over large blocks of data.

Instead, LDPC codes always have some overhead $\epsilon$. Associated with this overhead is a failure probability $\delta$. A given code will fail to reconstruct the original k source symbols from a set $(1+\epsilon)$ k encoding symbols with probability $\delta$.

Codes exist with $\delta<10^{-6}$ for overhead $\epsilon=2\%$.

LDPC codes over a variety of channel types can be decoded with a standard Belief Propagation or Message Passing algorithm, for example as described in Information Theory, Inference, and Learning Algorithms, David MacKay, Cambridge University Press, September 2003 (http://www.inference.phy.cam.ac.uk/mackay/Book.html). This is true for all types of channel over which LDPC codes might be used. In the case of the erasure channel, this algorithm becomes very simple and is described here in terms of the graph representation of the code, as shown in FIG. 2. Each node of the graph can be associated with a symbol. Initially, the left nodes are associated with the encoding symbols that have been received and the right (constraint) nodes are set to zero.

Step 1: for each left node which is associated with a symbol, add this symbol to each right node to which it is connected and remove the left node and all its edges from the graph Step 2: For each right (constraint) node with only one neighbour, set the left node to be equal to the right node and remove the right node and the edge from the graph.

Step 3: If all source symbols have been recovered, stop. Otherwise go back to step 1.

This algorithm can fail if there are no right (constraint) nodes with only one neighbour at step 2. It has been shown that the algorithm fails if and only if the sub-graph induced by the erased nodes contains a 'stopping set'—that is a set of left nodes for which the induced sub-graph has no edges of right degree one. (The right degree of an edge is the total number of edges incident on the right node connected to that edge). The design of a good code minimises the probability of such a set appearing.

The algorithm can easily be re-stated in terms of the matrix representation of the code as shown in FIG. 3 and this is how it would usually be implemented.

In practice, the algorithm is executed 'on the fly' as encoding symbols arrive. This spreads the computation load across the time taken for the packets to arrive.

Additionally, since the code is defined by a matrix as described above, it will be apparent that standard techniques for solving matrices could equally be applied to decoding the code (e.g. Gaussian elimination). In practice the matrices involved may be very large, rendering such techniques impractical. However, when decoding codes with relatively few source symbols (for example a few thousand), or at the later stages of decoding larger codes (when many of the symbols have been recovered and the remaining matrix is small), these techniques may be applied. Well-known techniques for efficient solving of sparse matrices may also be applied. This approach admits the use of codes which contain 'stopping sets' and results in a more efficient decoding in terms of overhead.

This additional (and optional) matrix solving step also allows the decoder to successfully decode other codes such as Reed-Solomon codes based on Cauchy or Vandermonde matrices as described in "An XOR-Based Erasure-Resilient Coding Scheme", Johannes Blömer, Malik Kalfane, Richard Karp, Marek Karpinski, Michael Luby and David Zuckerman (http://www.icsi.berkeley.edu/~luby/PAPERS/cauchypap.ps). These codes can be handled by the decoder by always sending exactly L encoding symbols together in each packet—where the Cauchy or Vandermonde matrix is calculated in $GF(2^L)$. In this way the encoding symbols are received or lost in blocks of L—corresponding to groups of L rows/columns in the parity matrix which were derived from a single row/column of the Cauchy or Vandermonde matrix over $GF(2^L)$. The sub-matrix of the parity matrix consisting of the groups of columns associated with missing packets will then be invertible according to the properties of Cauchy or Vandermonde matrices.

However, since the matrices used by these codes are relatively dense, this is only likely to be practical for relatively small codes. Furthermore, the structure of Cauchy and Vandermonde matrices admits certain optimisations in the matrix inversion which the universal decoder would not take advantage of.

The decoding algorithm described in the three steps above, plus the matrix solving step once the matrix becomes small, does not depend on the way the graph (such as that shown in FIG. 2) was constructed and this is the key to the design of the universal decoder. It is not necessary for the bytecode downloaded to the receiver to actually execute the above algorithm, only for it to generate the graph or matrix on which the above algorithm operates. As described above, this matrix defines the mapping between the original data packets and the encoded packets which have been received. The universal decoder takes the matrix which has been generated by the bytecode and executes the decoding algorithm on the symbols that have been received. The intensive part of the decoder (mainly the exclusive OR operations) is therefore implemented 'natively' where it can be optimised.

The bytecode may be executed within a 'Matrix Generator Virtual Machine' (MGVM). The bytecode for a given LDPC scheme is referred to as the 'MGVM program' for that scheme.

In practice, it may only be necessary for each receiver to download the MGVM program for a particular LDPC scheme once. It can then be reused for multiple transmissions using the same scheme. A unique identifier may be assigned to a scheme so that receivers can determine whether they already possess the correct MGVM program and if not so that they can obtain it (for example, this could be a URL at which the MGVM program can be downloaded).

The MGVM program provides two distinct procedures: initialise and process, as described below.

The initialise procedure receives the input of "Object Transmission Information" which contains parameters for the LDPC code to be used for this specific transmission. The procedure outputs one of more of:

The number of source symbols in the object to be received

A parity check matrix

'Closure indications' for each column of the matrix

The process procedure receives the input of "Packet Information" which contains parameters which describe a single encoding symbol received. The procedure outputs one of more of:

The identity of the encoding symbol (i.e. the matrix column it corresponds to)

Zero or more additional rows and/or columns to be added to the parity check matrix Zero or more additional 'Closure indications' for columns of the matrix The format of the Object Transmission Information and Packet Information are specific to the LDPC scheme in use i.e. they are not processed by the universal decoder, but only by the MGVM program.

The Object Transmission Information is received as part of the incoming data stream and includes parameters which specify the particular code (=matrix) within the LDPC scheme that will be used. For example, in general the matrix needs to be tailored to the size of the object that is to be sent. In many cases the matrix is generated pseudo-randomly, in which case a seed for the pseudo-random number generator must be communicated in order to ensure the correct matrix is generated.

The Packet Information is associated with a packet of data received by the decoder containing one or more encoding symbols. From this information the MGVM program must determine which matrix column or columns the encoding symbol or symbols is/are associated with.

In some schemes the parity matrix, shown as 302 in FIG. 3, is not completely known before the encoding symbols have arrived (indeed in some schemes it is initially completely empty). The process procedure may therefore also derive additional matrix rows and/or columns from information included in the Packet Information. In several schemes a single additional row and column are provided for each encoding symbol, with each new column corresponding to a received encoding symbol. In other schemes, the matrix is completely determined from the Object Transmission Information and no new rows or columns are added in the process procedure.

The initialize and process procedures may also supply 'closure indications' for matrix columns. These specify certain matrix columns as 'closed', which means that no further non-zero entries will be added to that column by the MGVM program. This is to support an optimization within the decoder in which parity symbols associated with closed columns are discarded to save memory.

The Matrix Generator Virtual Machine is a virtual machine designed specifically for the task of generating LDPC matrices. The MGVM executes an MGVM program which is provided in the form of a bytecode. The bytecode is designed specifically to make the task of matrix generation easy to code in as short a number of bytes as possible.

An example Virtual Machine design is described below.

The decoding algorithm is generally implemented 'on-the-fly' with encoding symbols being processed as they arrive. A number of techniques can be applied to optimize the operation of the decoder in this case, including but not limited to:

Grouping of Encoding Symbols

Encoding symbols can be processed one at a time. However, clearly, encoding symbols referenced by lower weight constraints will result in decoded source symbols in fewer operations. Therefore it may lower the total number of operations if encoding symbols are collected into groups and the lower weight constraints processed first.

Furthermore, performing the algorithm as encoding symbols arrive may lead to the recovery of a source symbol which is later received as a systematic encoding symbol. The early calculations would then have been redundant. This can be reduced by grouping the symbols before processing and eliminated by performing all processing once a sufficient number of encoding symbols have been received.

Note that processing capacity may not be the major constraint on file reception time—this may be the bandwidth of the connection over which the file is received. In this case, performing redundant calculations may not have any impact on overall reception/decoding time. However it may have a small impact on device power consumption and hence battery life for battery powered devices.

Delayed Calculation of Constraint Values

The algorithm described above calculated the 'current value' of each constraint—that is the sum of all the symbols received so far that are referenced by each constraint. However, not all constraints will eventually be used to discover new symbol values. If a constraint is not used, then all the calculations of its 'current value' are redundant. Calculation of the constraint value could therefore be delayed until all but one of the symbols it references has been decoded.

This approach is particularly useful for very high weight constraints (e.g. constraints attached to more than 10% of the left nodes). A few such high weight constraints are used in some codes to provide for recovery of the last few source symbols. These constraints will likely not recover any source symbols until right at the end of decoding, so consideration of these could be left until then.

However the above approach requires (both in general and for very high weight constraints specifically), that the values of the received encoding symbols must be kept in memory. By contrast, immediate calculation of the constraint values means that received parity symbols corresponding to 'closed' columns may be discarded.

Avoid Recovering Useless Parity Symbols

The algorithm described above may result in the recovery of parity symbols as well as recovery of source symbols. This is a desired operation when these new parity symbols can be further user to recover source symbols. However, it is possible that the new parity symbol is not reference by any constraints and so will not be useful (assuming the column is closed). Calculation of this new parity symbol could therefore be avoided.

Optimisation of Matrix Storage

As is well-known, sparse matrices can be most efficiently stored by storing for each column (or equivalently row) an ordered list of the rows (respectively columns) which have non-zero entries.

For efficient execution of the decoding algorithm, it may be necessary to store both such representations. This is because the algorithm needs to efficiently traverse both matrix rows and matrix columns:

A matrix column needs to be traversed to identify the constraints (rows) that involve a newly received or recovered encoding symbol.

A matrix row needs to be traversed to identify the encoding symbols (columns) that make up the constraint.

However, it can be noted that in implementations where the 'current value' of a constraint is maintained in memory, row traversal is only required to identify the single remaining element when the constraint weight reaches one. In this case, the row can be more efficiently stored by storing only the weight and the current sum of the column numbers of the elements. As received/recovered encoding symbols are summed into the current value of the constraint, the weight is decremented and the column numbers subtracted from the sum. When the weight reaches one, the index of the remaining column will be known. This sum need only be stored modulo the number of matrix columns.

The full list of row members may be required for the Gaussian elimination step. Since this occurs only when the matrix becomes small, it is possible to reconstruct the list from the column-by-column representation of the matrix.

Alternatively, further enhancements to the MGVM could provide for the MGVM program to reconstruct the required rows.

The description above assumes that the LDPC code is applied across the entire source data to be sent. In some cases it is advantageous to split the source data into several blocks (called source blocks) and apply the error correction code independently to each block. This is the case, for example, where the data is part of a multimedia streaming application. Applying the code to the whole source data in this case would mean that the presentation of the data to the user could not begin until the whole source data had been recovered. Equally, in broadcast applications the stream of source data is continuous.

Separate source blocks can be handled by independently applying the mechanisms described above to each block. More efficiently, the initialise procedure could be executed only once, and the resulting matrix and MGVM memory state stored for independent use with each source block.

Further, in some applications it may be advantageous to send encoding symbols from multiple source blocks in the same data packet. This has the effect of distributing the effect of losses across the different source blocks. The mechanisms described above can easily be enhanced to support this case by enhancing the information returned from the process routine to include an identifier for the source block along with the column number for each encoding symbol in the packet.

In many systematic codes, the computational load to decode the missing source symbols is related to the number of missing source symbols. The algorithm described below as an example begins decoding as soon as the minimum number of encoding symbols have been received.

In some circumstances, the decoder may be aware that further symbols will become available. Some of these further symbols may be source symbols. In this case, decoding computational load can be reduced by waiting for these source symbols before beginning decoding. For example, this will be the case in streaming applications where a fixed number of symbols are sent in each encoding block. The decoder may wait until a symbol is received from a subsequent encoding block before beginning decoding.

Furthermore, depending on the construction of the code, consideration of additional parity symbols above the minimum number of required symbols may either increase or decrease the computational load. For example, for Reed-Solomon codes, a number of parity symbols equal to the number of missing source symbols is required in order to achieve a 100% success probability. Consideration of additional parity symbols cannot improve this and will result in redundant computations. By contrast in certain other codes, additional parity symbols may provide for faster ways to compute some missing source symbols.

The output from the MGVM virtual machine initialise routine could therefore be extended with a Boolean indicating whether additional parity symbols should be considered if available.

Note that even if this is set to indicate that such symbols may be considered, the decoder may choose not to do this in order to complete the decoding sooner (in terms of time) and therefore deliver the decoded data sooner. This is particularly important in streaming applications.

A First Example Virtual Machine Design

A first example Virtual Machine design is described below which is modelled on a simple microprocessor and includes the usual basic machine instructions:

- Memory access commands (store and move values within the MGVM memory)
- Basic arithmetic operations (+,−, *, /, mod)
- Basic binary operations (bitwise AND, OR, XOR, left and right shift)
- Program control commands (conditional and unconditional transfer of control, call subroutine and return, exit)
- Stack operations (push and pop values from the stack)

The basic commands operate on 32-bit signed integer values.

In addition the MGVM includes support for some operations on arrays of integers. These are useful, for example, for storing lists of row or column indices which define entries in the parity matrix. An array consists of a 32-bit length value, n, followed by n 32-bit integer values.

The MGVM does not have a data type for the parity matrix itself as this is not stored in MGVM memory. Instead, primitive instructions are provided which set the value of elements of the matrix. There is no support for reading directly back from the matrix. The matrix does not have a fixed size since it is expected that the decoder implementation will only store information about the location of non-zero entries of the matrix.

The MGVM provides various more advanced commands specifically for the purpose of LDPC matrix generation:

- Commands to add non-zero elements to the parity matrix, specifically:
  - Add a single entry to a given row of column. This command returns an error if such an entry already exists. This is useful in the case that a specific number of elements must be added to a given row/column, since it informs the MGVM program that another column/row must be chosen for this entry.
- Commands for pseudo-random number generation (PRNG), specifically:
  - Initialise a PRNG register based on a given seed
  - Return the next value in the PRNG sequence
  - Return a value within a given range
  - Return a set of distinct values from within a given range with uniform probability
  - Return a value from a given range with probability according to a supplied probability distribution
- The exact pseudo-random number generator to be used must be defined and known to the encoder, so that encoder and decoder arrive at the same parity matrix. For example a linear congruential pseudorandom number generator, such as that described by Donald E. Knuth in The Art of Computer Programming, Volume 2: Seminumerical Algorithms, section 3.2.1.
- Commands based on linear feedback shift registers (LFSRs), specifically
  - step forward the LFSR at a given memory location based on the supplied mask identifying the tap positions. This operation consists of:
    1) read the 32-bit number at the specified memory location
    2) compute the logical AND of this with the 32-bit mask which is the other operand of the instruction
    3) compute the sum of the individual bits within the result (i.e. this will be one if the number of non-zero bits in the result is odd and zero otherwise)
    4) shift the bits in the original 32-bit number one place to the left
    5) set the lowest order bit to the result from step (3)

This operation is useful for generating random-looking permutations which are useful in the generation of the random LDPC matrices used in some codes. LFSRs have the property that for certain values of the tap mask and a non-zero starting value of the LFSR, the above operation will step the LFSR through every possible non-zero value less that $2^n$, where n is one greater than the highest bit position in the tap mask which has value one, each value occurring exactly once.

A random-looking permutation of the integers 1 . . . m can be obtained by choosing n such that $2^n > m$ and initialising the LFSR to a random number between 1 and m. At each step, the LFSR is repeatedly stepped forwards until another number less than or equal to m is obtained.

Extensions to the MGVM command set may be defined. Each extension will be allocated a unique 2-byte identifier. MGVM programs will include a field at the start of the bytecode in which the required extensions are listed. If the MGVM does not support any of the required extensions, the bytecode cannot be executed.

The following extensions are defined:

CHECK_CYCLE or ADDNOCYCLE

Operands: a row and column number and a cycle length

Operation: determines whether addition of an element at the supplied row and column will create a cycle of the given length or less. A cycle of length n is an ordered list of n nodes in the code graph in which adjacent pairs are joined by distinct edges and in which the first and last entries are joined by a further distinct edge. Since the graph is bi-partite, all cycles have even length. Cycles of length 2 would correspond to two nodes joined by two edges. This cannot occur in our matrix representation since each matrix entry is either zero or one, representing zero or one edges between the two nodes.

Cycles of length 4 correspond to two matrix columns (or equivalently two matrix rows) which overlap in two places. That is, there are two rows (respectively columns) in which both columns (respectively rows) have a non-zero entry. Certain codes can be made more efficient by eliminating such cycles.

SYSTEMATISE

Operands: two ranges of matrix columns (length k and k', k'>k)

Operation: considers the matrix as generating the k'encoding symbols corresponding to the second range of columns from the k encoding symbols corresponding to the first range of columns. Permutes the rows of the matrix so that the first k rows are linearly independent in the sense that they determine the k encoding symbols from the first range of columns from only k of the k'encoding symbols in the second range of columns.

This command can be used to make a non-systematic code systematic in the following way: The initial matrix corresponds to a non-systematic code in which the first range of columns corresponds to source symbols and the second range to encoding symbols. There must be enough encoding symbols that the source symbols can be completely reconstructed. If that is so, then there is a subset of the encoding symbols of size k which could be used to generate the source symbols by fully solving the matrix. The matrix is permuted so that the first k rows alone generate this subset of the encoding symbols from the k source symbols. The code can be made systematic by re-identifying the source symbols with the columns from the second range of columns which have entries in these first k rows. The columns which were previously identified with the source symbols (the first provided range of columns) now become 'intermediate' symbols, which are not transmitted. In the encoding process, these intermediate symbols must be explicitly calculated by inverting the matrix formed from the first k rows of the parity matrix. At the decoder, however, the parity matrix itself will allow reconstruction of the intermediate symbols through use of the normal decoding algorithm applied to received symbols (both source and parity symbols). The decoding algorithm then also provides for reconstruction of missing source symbols from the intermediate symbols.

Clearly, the above operation does not have a single unique result. In particular there may be several subsets of the second group of encoding symbols with the required property and the resulting rows may appear in any order. In order for the encoder to arrive at the same result as the decoder, a unique (canonical) result must be required by the MGVM definition. For example, it could be required that the rows chosen are the first k in the matrix with the above property, that they remain in the same order and that the removed rows also remain in the same order.

The MGVM is assumed to have a virtual memory on which the basic commands operate. The size of this memory is a parameter of the MGVM program—i.e. the program specifies how much memory it needs and if there is not enough, execution is not allowed. The program specifies a fixed memory size for each of the initialise and process routines. The contents of this memory are persistent between calls to these routines.

A command is also provided for the MGVM program to request additional memory.

Instructions which reference memory addresses can provide the address in short (1 byte) or long (4 byte) form. The length of the address is dependent on the instruction. This provides for optimizing instruction length for more commonly accessed memory locations, particularly the first 256 bytes of memory which are intended as a general-purpose scratchpad.

MGVM instructions consist of the following fields:

Instruction code (mandatory): single byte instruction codech

Operands (optional): the types of the operands are determined by the instruction code The types of operands are described below.

Operands evaluate to either a 32-bit signed integer, a memory location where a 32-bit signed integer is stored or a memory location at which an array of 32-bit integers is stored.

The following types of operand are supported:

| | |
|---|---|
| Literals | The operand consists of an actual 32-bit operand value |
| Memory references | The operand consists of a short or long memory address at which the 32-bit operand value, or array of 32- bit values can be found |
| Pointer references | The operand consists of a short, medium or long memory address at which a 32-bit value can be found. This value is interpreted as a memory address at which the 32-bit operand value, or array of 32- bit values can be found. |
| Offset pointer reference | The operand consists of a short memory address followed by a single octet value. This value is added to the 32-bit value found at the specified memory address to obtain the address at which the 32-bit operand value, or array of 32- bit values can be found. |
| Indexed pointer reference | The operand consists of a short, medium or long memory address followed by a second short, medium or long memory address. The 32-bit values at these memory addresses are summed to obtain the address at which the 32-bit operand value, or array of 32- bit values can be found. |

The MGVM Virtual Machine has one internal register called result. This takes the following values:

POSITIVE

ZERO

NEGATIVE

The value of result is set based on the result of certain instructions and is used by conditional transfer of control instructions to determine where program control should be transferred to.

| Instruction code | Instruction/Mnemonic | Operation |
|---|---|---|
| | Memory access | |
| 0x00 | LOAD $,## | Op1 := Op2; set result |
| 0x01 | LOAD ($), ## | |
| 0x02 | LOAD ($,#), ## | |
| 0x03 | LOAD ($,$), ## | |
| 0x04 | LOAD $,$ | |
| 0x05 | LOAD ($),$ | |
| 0x06 | LOAD ($,#),$ | |
| 0x07 | LOAD ($,$),$ | |
| 0x08 | LOAD $,($) | |
| 0x09 | LOAD $,($,#) | |
| 0x0a | LOAD $,($,$) | |
| 0x0b | | |
| | Basic arithmetic | |
| 0x0c | INCREMENT $ | Op1 := Op1 + 1; set result |
| 0x0d | INCREMENT ($) | |
| 0x0e | DECREMENT $ | Op1 := Op1 − 1; set result |
| 0x0f | DECREMENT ($) | |
| 0x10-1a | ADD (as LOAD) | Op1 := Op1 + Op2; set result |
| 0x1b | ADD $,$,## | Op1 := Op2 + Op 3; set result |
| 0x1c | ADD $,$,$ | |
| 0x1d | ADD ($),$,$ | |
| 0x1e | ADD ($,#),$,$ | |
| 0x1f | ADD ($,$),$,$ | |
| 0x20-2a | SUBTRACT (as LOAD) | Op1 := Op1 − Op2; set result |
| 0x2b-2f | SUBTRACT (as ADD) | Op1 := Op2 − Op3; set result |
| 0x30-3a | MULTIPLY (as LOAD) | Op1 := Op1 * Op2; set result |
| 0x3b-3f | MULTIPLY(as ADD) | Op1 := Op2 * Op3; set result |
| 0x40-4a | DIVIDE (as LOAD) | Op1 := Op1/Op2; set result |
| 0x4b-4f | DIVIDE (as ADD) | Op1 := Op2/Op3; set result |
| 0x50-5a | MOD (as LOAD) | Op1 := Op1 mod Op2; set result |

-continued

| Instruction code | Instruction/Mnemonic | Operation |
|---|---|---|
| 0x5b-5f | MOD (as ADD) | Op1 := Op2 mod Op3; set result |
| | Basic binary operations | |
| 0x60 | AND $, ## | Op1 := Op1 AND Op2; set result |
| 0x61 | AND ($),## | |
| 0x62 | AND ($,#),## | |
| 0x62 | AND ($,$), ## | |
| 0x63 | AND $,$ | |
| 0x64 | AND ($), $ | |
| 0x65 | AND ($,$),$ | |
| 0x66 | AND ($,#),$ | |
| 0x67 | AND ($,$),$ | |
| 0x68-6f | OR (as AND) | Op1 := Op1 OR Op2; set result |
| 0x70-0x77 | XOR (as AND) | Op1 := Op1 XOR Op2; set result |
| 0x80 | LSHIFT $,# | Op1 := Op1 << Op2; set result |
| 0x81 | LSHIFT ($),# | |
| 0x82 | LSHIFT ($,#),# | |
| 0x83 | LSHIFT ($,$),# | |
| 0x84 | LSHIFT $,$ | |
| 0x85 | LSHIFT ($),$ | |
| 0x86 | LSHIFT ($,#),$ | |
| 0x87 | LSHIFT ($,$),$ | |
| 0x88-0x8f | RSHIFT (as LSHIFT) | Op1 := Op1 >> Op2; set result |
| 0x90-0x97 | ARSHIFT (as LSHIFT) | Op1 := Op1 >>> Op2; set result |
| | Program control | |
| 0xa0 | JUMP @ | Unconditional jump |
| 0xa1 | CALL @ | Procedure call |
| 0xa2 | RETURN | Return from procedure |
| 0xa3 | BRP @ | Branch if result is POSITIVE |
| 0xa4 | BRPZ @ | Branch if result is ZERO or POSITIVE |
| 0xa5 | BRN @ | Branch if result is NEGATIVE |
| 0xa6 | BRNZ @ | Branch if result is ZERO or NEGATIVE |
| 0xa7 | BRZ @ | Branch if result is ZERO |
| 0xa8 | SWITCH @,@,@ | If result is POSITIVE, branch to Op1<br>If result is ZERO, branch to Op2<br>If result is NEGATIVE, branch to Op3 |
| 0xa9 | EXIT$ | Exit processing. $Op1 is the address of the returned data structure. |
| 0xaa | EXIT $$ | |
| 0xab | EXIT ($) | |
| 0xac | FAIL | Execution failure |
| | Memory control commands | |
| 0xad | REQUESTMEMORY $ | Allocate additional memory to the MGVM.<br>If successful set result: = POSITIVE.<br>If not set result := ZERO |
| | Stack operations | |
| 0xb0 | PUSH ## | (SP) := Op1; SP := SP−4; set result |
| 0xb1 | PUSH $ | |
| 0xb2 | PUSH ($) | |
| 0xb3 | PUSH ($,#) | |
| 0xb4 | PUSH ($,$) | |
| 0xb5-b9 | POP (as PUSH) | SP := SP+4; Op1 := (SP); set result |

-continued

| Instruction code | Instruction/Mnemonic | Operation |
|---|---|---|
| | Array operations | |
| 0xba | LOADARRAY $$,[##] | Copy the literal array Op2 to Op1 |
| 0xbb | LOADARRAY ($), [##] | |
| 0xbc | FINDINARRAY $, $, ($) | Find the value Op2 in the array Op3; |
| 0xbd | FINDINARRAY $,($), ($) | |
| 0xbe | FINDINARRAY $,($,#),($) | Set Op1 to the index at which it was found or −1; |
| 0xbf | FINDINARRAY $,($,$),($) | Set result based on value of Op1; |
| | Pseudo-Random Number Generator | |
| 0xc0 | SEED ##,## | PRNG := (((Op1 << 32)+Op2) ^ 0x5DEECE66DL) & ((1 << 48) − 1) |
| 0xc1 | SEED $ | (Op1 is 64bit-value at given address)<br>PRNG := (Op1 ^ 0x5DEECE66DL) & ((1 << 48) − 1) |
| 0xc2 | RAND $ | PRNG := (PRNG * 0x5DEECE66DL + 0xBL) & |
| 0xc3 | RAND ($) | ((1 << 48) − 1); |
| 0xc4 | RAND ($,#) | Op1 := PRNG >>> 16; |
| 0xc5 | RAND ($,$) | |
| 0xc6 | RANDRANGE $,$ | (RAND is the operation defined above) |
| 0xc7 | RANDRANGE ($),$ | if ((Op2 & −Op2) == Op2)<br>{// i.e., n is a power of 2 |
| 0xc8 | RANDRANGE ($,#), $ | Op1 := (Op2 * (RAND >> 1)) >> 31; |
| 0xc9 | RANDRANGE ($,$), $ | } else {<br>int bits, val;<br>do {<br>bits = RAND >> 1;<br>val = bits % Op1;<br>} while(bits − val + (Op1−1) < 0);<br>Op1 := val;<br>} |
| 0xca | RANDRANGEN $,$,$ | (Creates an array of length Op3 or distinct random values between 0 and Op2−1).<br>RANDRANGE(n) is the operation defined above with second operand n)<br>($Op1) := Op3; // this is the length of the returned array<br>for(int i=0;i<Op3,i++) {<br>do {<br>int rand = RANDRANGE(Op2);<br>} while rand not previously chosen;<br>($Op2 + 4 *(i+1)) := rand;<br>} |
| 0xcb | RANDDIST $,$ | (Chooses a random number based on a probability distribution stored at Op2. The probability distribution is stored as a 32-bit length (n) followed by unsigned 32-bit values forming a cumulative probability distribution. The returned value is between 0 and n inclusive)<br>int rand = RAND;<br>int i=0;<br>while ((i<Op2) && (rand<($Op2 + 4*i)) i++;<br>Op1 := i; |
| | Linear feedback shift register | |
| 0xcd | LFSR $,## | (Steps the LFSR at Op1 using the mask Op 2) |
| 0xce | LFSR $,$ | int tapbits := Op1 & Op2;<br>Op1 := Op1 << 1;<br>if (number of non-zero bits in tapbits is odd) {<br>Op1 := Op1 + 1;<br>} |
| | Matrix operations | |
| 0xd0 | ADDELEMENT $,$ | If element at row Op1, column Op2 already non-zero, then set result := ZERO<br>else set element at row Op1, column Op2. set result=POSITIVE; |
| 0xd1 | ADDROW $,$ | Set elements in row Op1 according to column numbers in array at Op2 |
| 0xd2 | ADDCOLUMN $,$ | Set elements in column Op2 according to row numbers in array at Op1 |
| 0xd3 | CLOSECOLUMN $ | Close column Op1 |
| 0xd4 | CLOSEALL | Close all columns with non-zero weight |
| 0xd5 | ADDIDENTITY $,$,$ | Add an identity matrix of size Op3 × Op3 to the parity matrix, placing the top left element of the identity matrix at row Op1, column Op2. |
| 0xd6 | SETZERO $,$ | Set the element at row Op1, column Op2 to zero |
| 0xd7 | SETZERO $,$,$,$ | Zero the whole matrix area from row Op1, column Op2 to row Op3, column Op3 |
| 0xd8 | ADDNOCYCLE $,$,$ | If adding the element at row Op1, column Op2 would create a cycle of length 2*Op3 or less then set result := ZERO;<br>Else set the element at row Op1, column Op2. set result := POSITIVE; |
| 0xd9 | SYSTEMATISE $,$,$,$ | Systematise the matrix. See above for detailed description. Forst range of columns is Op1 to Op2 inclusive. Second range is Op3 to Op4. |

Key
1-byte literal
4-byte literal
$ 1-byte memory reference
$$ 4-byte memory reference
($) 1-byte pointer reference
($,#) 1-byte offset pointer reference with 1-byte literal offset
($,$) 1-byte indexed pointer reference with 1-byte memory reference index
SP Stack Pointer: Internal 4-byte MGVM variable
PRNG Pseudo-random number generator internal register: 64 bits
Opn 32-bit value of the nth operand (unless otherwise stated)
$Opn 32-bit address of the nth operand (for non-literal operand types)
(mem) 32-bit value at address mem
[##] Array of 32-bit literals (first 32 bits provides the length).

An MGVM program consists of the actual bytecode for the program preceded by a header with the following format:

| Field | Length | Contents |
|---|---|---|
| @Initialise | 2 octets | Offset from start of header to first instruction of Initialise procedure |
| @Process | 2 octets | Offset from the start of header to first instruction of Process procedure |
| InitialiseMemory | 4 octets | Initial size of memory required for Initialize procedure |
| ProcessMemory | 4 octets | Initial size of memory required for Process procedure |
| Object_Information_Address | 2 octets | Address at which Object Information should be placed for the Initialise routine |
| Object Information Size | 2 octets | Size of the Object Information in bytes |
| Packet_Information_Address | 2 octets | Address at which Packet Information should be placed for the Process routine |
| Packet Information Size | 2 octets | Size of the Packet Information in bytes |
| Number of extensions (Ne) | 2 octets | Number of extension required |
| Extension codes | 2*Ne | Extension codes for required extensions |

The following extension codes are defined:

| Extension code | Meaning |
|---|---|
| 0x0001 | ADDNOCYCLE command required |
| 0x0002 | SYSTEMATISE command required |

The Initialise routine returns data structures as follows:

| Field | Length | Contents |
|---|---|---|
| K | 4 bytes | Number of source symbols |
| SymbolSize | 4 bytes | Size in bytes of each source/encoding symbol |
| K' | 4 bytes | Number of encoding symbols for target failure probability |

The Process routine returns data structures as follows:

| Field | Length | Contents |
|---|---|---|
| n | 4 bytes | Number of encoding symbols in the received packet |
| BlockSize | 4*n bytes | Column number of each encoding symbol |

Examples of Improvements to the First Example of a Virtual Machine

MGVM programs for some codes can be written more efficiently if a new MGVM instruction is introduced to add elements to the matrix according to a supplied bit mask:

Instruction: ADDCOLUMNBITS $,$,$

Operation: Add elements to column Op2, according to the bitmask Op3, starting at row Op1. Specifically, IF (Op3 & $\mathbf{2}^i$) !=zero then set the element at row Op1+i, Column Op2 to one, for 0<=i<32

This instruction is useful in at least two cases:

Reed-Solomon codes

In this case it is necessary to add to the matrix a binary matrix representation of a finite field element. If the finite field is $GF(2^1)$ then this is an 1×1 binary matrix whose columns consist of the binary representations the field element multiplied by $\alpha^i$ for 0<=i<1 where $\alpha$ is a primitive element of the field. These are just 1 consecutive elements of the exponentiation (or anti-log) table for the field.

Hamming codes

Hamming codes are well known. In matrix representation, each column of a hamming code contains a distinct binary number. A hamming code can easily be created using the above instruction by stepping the bit-mask through consecutive binary numbers of the appropriate size.

Encoding can be made simpler if the parity columns are given numbers of the form $\mathbf{2}^i$.

Reed-Solomon codes in particular require certain finite field operations to construct the parity matrix. These are most easily carried out using discrete logarithm tables, which are constructed by the MGVM program before beginning construction of the matrix.

The described design of the MGVM can be modified in two ways to make this simpler and more efficient:

The present design supports only 32-bit operand values. This results in a certain amount of inefficiency, for example when storing a table of 256 8-bit values, 1024 memory locations would be required. Instructions could be provided which act on 8-or 16-bit values in memory to avoid this disadvantage.

The instructions supporting Linear Feedback Shift Registers (LFSRs) have been described in terms of the usual LFSR construction. However, an alternative construction—sometimes called Galois LFSRs—can be used which has the same properties with respect to the original purpose of these instructions in the MGVM (generating random-looking permutations).

In a Galois LFSR, then at each stage, the LFSR register is first shifted by one bit to the left. If the bit corresponding to the highest order bit of the bit-mask is set to one, then the value of the LFSR is exclusive or-ed with the bit-mask.

This alternative construction has the advantage that the same operation can be used to construct a discrete logarithm (and exponentiation or anti-logarithm) table for the finite fields $GF(\mathbf{2}^i)$.

An Example of a Simple Assembly Language for MGVM Bytecode

A simple assembly language for MGVM bytecode is described by way of example as follows:

```
<MGVM program> := 1* ([ <command> / <directive>] [ <comment>]
<CRLF>)
<comment> := ";" *<VCHAR>
<command> := [ <label>] (<data> / <instruction>)
<label> := <symbol> ":"
<data> := ( "0x" 1*HEXDIG ) / <symbol>
<instruction> := <operator> [*(<operand> ",") <operand>]
<operator> := "LOAD" / "ADD" / "SUBTRACT" / "MULTIPLY" /
"DIVIDE" / "MOD" / "AND" / "OR" / "XOR" / "INCREMENT" /
"DECREMENT" / "LSHIFT" / "RSHIFT" / "ARSHIFT" / "JUMP" /
"CALL" / "RETURN" / "BRP" / "BRZP" / "BRN" / "BRZN" /
"BRZ" / "SWITCH" / "EXIT" / "FAIL" / "REQUESTMEMORY" /
"PUSH" / "POP" / "LOADARRAY" / "FINDINARRAY" /
"SEED" / "RAND" / "RANDRANGE" / "RANDRANGEN" /
"RANDDIST" / "LFSR" / "ADDELEMENT" / "ADDROW" /
"ADDCOLUMN" / "ADDIDENTITY" / "CLOSECOLUMN" /
"CLOSEALL" / "SETZERO" / "ADDNOCYCLE" /
"SYSTEMATISE"
<operand> := <literal> / <reference> / <pointer> /
```

-continued

```
<offsetPointer> / <indexPointer> / <literalArray> / <offset>
<literal> := "#" ( ("0x" 1*HEXDIG ) / 1*DIGIT )
<reference> := ("0x" 1*HEXDIG) / 1*DIGIT
<pointer> := "(" <reference> ")"
<offsetPointer> := "(" <reference> "," <literal> ")"
<indexPointer> := "(" <reference> "," <reference> ")"
<literalArray> := "[ " * (<literal> ",") <literal> "]"
<offset> := <symbol>
<directive> := <defineDirective>
<defineDirective> := "#define" <symbol> "=" DQUOTE 1*VCHAR
DQUOTE
<symbol> := 1*ALPHA
```

Linear white space is ignored. The '#define' directive associates a symbol with a string. The directive causes all subsequent occurrences of the symbol to be replaced by the string before parsing continues. The <data> form causes the supplied data to be written to the output stream or an offset from the start of the header to the supplied label to be written as a two-octet string. An exact number of octets are output depending on the supplied hex digits ('0' is prepended if there are an odd number of digits.)

A Second Example Virtual Machine Design

According to an alternative implementation of the Universal Decoder concept, the downloaded bytecode is able to control not only the generation of the matrix describing the code, but also has high-level control of the operation of the decoder itself.

The downloaded code controls the timing and sequence of decoding operations with respect to the receipt of encoding symbols. For example the number of encoding symbols required and which encoding symbols and matrix rows/columns should be considered at which time. The overall efficiency of the decoding operation, in terms of the number of symbols which must be stored and the number of symbol XOR operations is highly dependent on these factors. This alternative implementation allows these choices to be optimised for the code in question.

As an example, when decoding certain codes, the efficiency can be improved by considering lighter weight rows first. This approach allows such optimisations to be embedded in the downloaded bytecode, rather than within the pre-installed decoder instead.

Note that both the approaches shown in the first and second examples have advantages. The approach described here adds considerable complexity to the bytecode language, interpreter implementation and the bytecode itself. However, it is more likely that as yet undiscovered code optimisations can be represented in this bytecode, when compared to the simpler implementation described previously.

It should be noted that other approaches are also possible in which the level of control exercised by the downloaded code varies from minimal (as in the first described implementation) to complete (in which the downloaded code is a complete implementation of the decoder in some general-purpose interpreted language, for example Java bytecode).

The decoder itself remains in control of the following aspects:

- storage of and basic operations on encoding symbols
- storage of and basic operations on the code matrix
- performing XOR operations upon encoding symbols, under control of the bytecode
- coordination and/or interleaving between source blocks (the VM sees only a single source block)

To operate in this mode, the following modifications are required to the virtual machine:

- the code provided has a single entry point, rather than separate 'initialise' and 'process' entry points
- additional instructions for:
  - requesting additional encoding symbols
  - associating encoding symbols with matrix columns (in which case the symbol represents the final value of the source of parity symbol associated with the column)
  - associating encoding symbols with matrix rows (in which case the symbol represents the 'current value' of the constraint—the sum of the symbol, plus the symbols associated with columns with non-zero entries is zero)
  - set a matrix element to zero, also causing the appropriate XOR operation to be performed on the row/column objects
  - managing submatrices of the matrix (i.e. defining submatrices, adding and removing matrix rows/columns from a submatrix, performing operations on submatrices)
    - The decoding process operates on a sub-matrix of the whole matrix, which can be interated over (by rows or columns), added to or removed from. Rows and columns are referred to by their absolute row and column indices at all times.
    - Rows and columns with no entries are 'invisible' and are not considered, except that the symbol associated with an empty column will be kept if it is a source symbol and may be kept if it is a parity symbol.
  - process a matrix row as far as possible, i.e. zero every element within the current subset for which the column symbol is known
  - determining the weight of a row or column of a submatrix
  - determining the lowest weight row in a submatrix
  - add one row to another row, within a submatrix
  - loop over all rows or columns of a submatrix
  - loop over all non-zero elements in a row of column of a submatrix Encoding symbols are represented within the virtual machine as 32-bit values which are interpreted by the virtual machine as references to the symbols in some implementation-specific way. For example, these could be simple indicies into a table in which symbols are stored, or a memory offset into some symbol buffer etc. Negative or zero symbol reference means that the symbol value is not known.

As soon as the decoder decodes the last source symbol, execution is automatically stopped.

Example additional instructions are shown in the table below:

| | | |
|---|---|---|
| 0xdf | FETCH $,$,($), ($) | Fetch between Op1 and Op2 packets.<br>Store the FEC Packet Information at Op3. Store the list of symbol IDs at Op4. |
| 0xe0 | SET_COLUMN_SYMBOL $,$ | Associate the symbol ID Op2 with column Op1. If the symbol is already associated with a row, this association can be discarded. |
| 0xe1 | SET_COLUMN_SYMBOL $,($,$) | |

-continued

| | | |
|---|---|---|
| 0xe2 | SET_ROW_SYMBOL $,$ | Associate the symbol ID Op2 with |
| 0xe3 | SET_ROW_SYMBOL $,($,$) | row Op1. |
| 0xe4 | GET_COLUMN_SYMBOL $,$ | |
| 0xe5 | GET_ROW_SYMBOL $,$ | |
| 0xe6 | XOR_ELEMENT $,$, $ | If row Op1, column Op2 is non-zero and there is a symbol associated with column Op2, XOR then,<br>Set row Op1, column Op2 to zero<br>XOR the symbol associated with row Op2 into the symbol associated with row Op1 (first creating an ‘all-zero’ symbol for row Op1 if non exists).<br>If the row weight is now one, then the symbol associated with the one remaining column is set to be equal to the symbol associated with the row, the one remaining element is set to zero, result is set to POSITIVE and Op3 is set to the decoded column index<br>If the row weight is >1, then result is set to ZERO<br>If the operation was unsuccessful, then result is set to NEGATIVE. |
| 0xe7 | SET_SUBMATRIX $,$,$,$ | Set the current sub-matrix to rows Op1 to Op3, columns Op2 to Op4 |
| 0xe8 | ADD_ROW $ | Add row Op1 to the sub-matrix |
| 0xe9 | ADD_COLUMN $ | Add column Op1 to the sub-matrix |
| 0xea | REMOVE_ROW $ | Remove row Op1 from the sub-matrix |
| 0xeb | REMOVE_COLUMN $ | Remove column Op1 from the sub-matrix |
| 0xec | REMOVE_ROWS $,$ | Remove rows Op1 to Op2 from the sub-matrix |
| 0xed | REMOVE_COLUMNS $,$ | Remove columns Op1 to Op2 from the sub-matrix |
| 0xee | XOR_ROW $ | Perform XOR_ELEMENT for every non-zero element of row Op1 that is within the current sub-matrix |
| 0xef | ROW_WEIGHT $,$ | Op1 := weight of row Op2 within the current sub-matrix |
| 0xf0 | COLUMN_WEIGHT $,$ | Op1 := weight of column Op2 within the current sub-matrix |
| 0xf1 | LIGHTEST_ROW $ | Op1 := lightest row in the current sub-matrix |
| 0xf2 | SUM_ROWS $,$ | Add row Op2 to row Op1<br>If this results in row Op1 having weight 1, then the decoded symbol is associated with the appropriate column, and result is set to POSITIVE. Otherwise result is set to ZERO. |
| 0xf3 | WHOLE_MATRIX | Set the current sub-matrix to be the whole matrix |
| 0xf4 | EMPTY_MATRIX | Set the current sub-matrix to be the empty matrix |
| 0xf5 | FOR_ROWS $ | Loops over all rows in the current sub-matrix. Instructions following this one, up to the matching LOOP_NEXT are executed repeatedly, with Op1 set to the index of each row.<br>There is no guarantee of the order in which the rows will be processed.<br>Rows that are added to the current submatrix during the process will be considered. |
| 0xf6 | FOR_COLUMNS $ | |
| 0xf7 | FOR_ROW_ELEMENTS $,$ | Loops through the non-zero elements of row Op2 |
| 0xf8 | FOR_COLUMN_ELEMENTS $,$ | Loops through the non-zero elements of column Op2 |
| 0xf9 | END_FOR | Loops back to the start of the FOR loop at the top of the FOR stack, or removes this FOR stack entry if there are no more elements to process. |
| 0xfa | BREAK_FOR | Removes the entry at the top of the FOR stack, without looping back |
| 0xfb | BR_ROW_DECODED $, @ | Branch if weight of row $ (in the matrix, not the current sub-matrix) is one |
| 0xfc | NROWS $ | Get number of rows in the current sub-matrix |
| 0xfd | NCOLUMNS $ | Get number of columns in the current sub-matrix |
| 0xfe | DISCARD_ROW $ | Completely discard row Op1 |
| 0xff | DISCARD_COLUMN $ | Completely discard the column Op1 |

An example VM program which implements the a basic decoding algorithm is shown below. This code would appear after the VM program which demonstrated the matrix. We assume that this portion of code has calculated the number of symbols (k), the number of required encoding symbols (m) and the number of symbols per packet (spp). The FEC Packet information is a 4-byte packet index (i). The packet contains spp symbols corresponding to columns (spp*i)+1 to (spp*(i+1)). The number of symbols per packet is known to the decoder (perhaps a standard field in the FEC Object Information).

```
#define k="0x80"          ; number of source symbols
#define size="0x84"       ; symbol size
#define m="0x88"          ; number of encoding symbols required
#define spp               ; symbols per packet
#define packetInfo        ; address for packet information
#define symbolList        ; address of symbol list
#define minpackets        ; minimum number of packets to fetch
#define maxpackets        ; maximum number of packets to fetch
#define noofsymbols       ; number of symbols received
#define index             ; loop index variable
#define symbol            ; symbol id
#define column            ; general-purpose column
```

-continued

```
#define row                     ; general-purpose row
#define gaussbool               ; zero is Gaussian elimination already
attempted
    LOAD packetInfo, #0x100                        ; 6
    LOAD symbolList, #0x200                        ; 6 12
    LOAD minpackets, #1                            ; 3 15
    LOAD maxpackets, #1                            ; 3 18
    LOAD noofsymbols, #0                           ; 3 21
    LOAD gaussbool, #1                             ; 3 24
    EMPTY_MATRIX                                   ; 1 25
; first fetch packets until we have enough symbols
; add the column associated with each received symbol to the current
sub-matrix
forpacket;
    FETCH minpackets, maxpackets, (packetInfo),         ; 5
    (symbolList)
    ADD noofsymbols, spp                                ; 3 8
    LOAD column, (packetInfo)                           ; 3 11
    MULTIPLY column, spp                                ; 3 14
    INCREMENT column                                    ; 2 16
    LOAD index, #0                                      ; 3 19
forsymbol:
    COLUMN_SYMBOL column, (symbolList,index)            ; 4 23
    ADD_COLUMN column                                   ; 2 25
    INCREMENT index                                     ; 2 27
    SUBTRACT scratch, index, spp                        ; 4 31
    BRN forsymbol                                       ; 3 34
    SUBTRACT scratch, noofsymbols,m                     ; 4 38
    BRN forpacket                                       ; 3 42
; for all columns with received symbols, substitute the
symbol up into the matrix
; this can result in additional columns being added to the current
sub-matrix as symbols
; are decoded. These will be considered in the same loop
; We check that we really do have a symbol for each column -
this is for the case that
; we have just performed Gaussian elimination, so we don't have
a record of which columns
; have decoded symbols. This approach is not so elegant -
it would be better to keep track
; of the set of columns that were decoded during the Gaussian
elimination
backsub: FOR_COLUMNS column                                 ; 2 44
         GET_COLUMN_SYMBOL symbol, column                   ; 3 47
         BRZ unknown_symbol                                 ; 3 50
         FOR_COLUMN_ELEMENTS row, column                    ; 3 53
             XOR_ELEMENT row,                               ; 4 57
             column, decodedcolumn
             BRNZ no_new_column                             ; 3 60
             ADD_COLUMN decodedcolumn                       ; 2 62
no_new_column:          END_FOR                             ; 1 63
unknown_symbol:END_FOR                                      ; 1 64
; now perform a Gaussian elimination, choosing the pivot point
at the lightest column of the lightest row
    LOAD scratch, gaussbool                                 ; 3
    BRZ failure                                             ; 3 6
    LOAD gaussbool, #0                                      ; 3 9
gauss:   WHOLE_MATRIX                                       ; 1 65
row      LIGHTEST ROW minrow                                ; 2 67
loop:
    LOAD minweight, #7FFFFFFF                               ; 6 73
    FOR_ROW_ELEMENTS column, minrow                         ; 3 76
         GET_COLUMN_WEIGHT weight, column                   ; 3 79
         SUBTRACT scratch, minweight, weight                ; 4 83
         BRNZ not_less                                      ; 3 86
         LOAD minweight,weight                              ; 3 89
         LOAD mincolumn, column                             ; 3 93
not_less: END_FOR                                           ; 1 94
    FOR_COLUMN_ELEMENTS row, mincolumn                      ; 3 97
         SUBTRACT scratch, row, minrow                      ; 4 101
         BRZ skip_pivot                                     ; 2 103
         SUM_ROWS row, minrow                               ; 3 106
skip_pivot:  END_FOR                                        ; 1 107
; if the pivot row had weight 1, then we decoded a symbol and
we can discard the row altogether
; otherwise just remove it from further consideration in the
Gaussian elimination algorithm
GET_ROW_WEIGHT weight, minrow                               ; 3 110
SUBTRACT weight, #1                                         ; 3 113
BRP weight_gt_one                                           ; 3 116
```

-continued

```
DISCARD_ROW minrow                                          ; 2 118
JUMP continue                                               ; 3 121
weight_gt_one: REMOVE_ROW minrow                            ; 2 123
continue: NROWS scratch                                     ; 2 125
          BRZ end_gauss                                     ; 3 128
          JUMP rowjoop                                      ; 3 131
end_gauss: WHOLE MATRIX                                     ; 1 132
          JUMP backsub                                      ; 3 135
Failure:           EXIT                                     ; 1 136
; Total 25 + 9 + 136 = 170 octets
```

Note that, in this example, at each stage of the Gaussian elimination, if a row of weight one is created, this will be chosen as the lightest row in the next iteration. This iteration will then back-substitute the decoded value into the remaining rows, but not into rows which have already been considered. At the end of back-substitution, there should remain some columns whose symbols are known, but with non-zero weight. These are the ones which should be reconsidered in the second back-substitution step. Here, we just skip these up in the back-substitution step.

Possible further enhancements to the VM language include:

- Branch operations conditional on direct variable comparisons. This would save a separate instruction to perform a subtraction before branching on result.
- Instead of tracking sub-matrices, separately track a column subset and a row subset i.e. describe in terms of "current row-set" and "current column-set"
- define default row and column registers (e.g. at memory locations 0×00 and 0×04) which would be used by various of the commands which take row or column numbers as operands The above design places responsibility on the decoder to maintain consistency between the matrix and the stored symbols. This is done by specifying that manipulations performed on the matrix should automatically cause the appropriate symbol manipulations For example, setting a matrix element to zero causes the corresponding column object to be sumed into the row object.

In a further modification of the above design, control of this consistency can be passed to the bytecode program. In this modified design, the instructions for modifying the matrix would do only that, and separate instructions would cause the symbol operations to be performed.

It will be apparent that further modifications could provide for more or less control of the decoder operation to be given to the bytecode program. Providing more such control admits greater code-specific optimisation of the decoding process. The design of a universal decoder MGVM should consider the tradeoff between these potential optimisations and the additional complexity of the MGVM itself and the bytecode programs.

An Example of a Decoder Algorithm

The following is a description of a decoding algorithm for the universal decoder which will decode any code with optimal efficiency in terms of reception overhead and failure probability. It is not necessarily optimal in terms of computational efficiency.

The algorithm consists of standard techniques of substitution and Gaussian Elimination, applied alternately until the all symbols have been recovered.

In the case of the first described MGVM design above, this algorithm would be implemented within the universal decoder itself. In the case of the second described MGVM design above, bytecode instructions can be provided which describe the algorithm defined here.

Depending on the construction of the code, the Gaussian Elimination step may not be performed. It is an important consideration in the design of good codes to avoid constructions which will require Gaussian Elimination when the number of non-empty matrix rows is very large, since this will require a large amount of computation.

Notation:

| | |
|---|---|
| matrix | The matrix generated by the Matrix Generator Virtual Machine |
| row[i] | the ith row of the matrix |
| column[j] | the jth column of the matrix |
| row[i].value | a symbol value associated with row[i] |
| column[j].value | a symbol value associated with column[i] |
| row[i].weight | the number of non-zero elements in row[i] |
| column[j].weight | the number of non-zero elements in column[i] |
| row[i].considered | Boolean indicating whether the row has been considered in the Gaussian elimination step |
| $\epsilon$ | the code reception overhead |
| k | the number of source symbols |
| row[i].elements | the set column indicies for columns with non-zero entries in row[i] |
| column[j].elements | the set of row indicies for rows with non-zero entries in column[j] |
| (i,j) | the matrix element at row i, column j. |
| i, j, jj | integers |
| pendingColumns | a set of integers giving indicies of columns yet to be processed |
| $\oplus$ | bitwise exclusive OR operation |

Input:

k, $\epsilon$, $(1 + \epsilon)$k encoding symbols
Algorithm:

Note: Matrix columns 1, . . . , k correspond to source symbols.
START

1) Call the MGVM to intialise matrix
    2) FOR all i, j
        2.1) Set row[i].value to the symbols containing all zero bits
        2.2) Set column[j].value to <no value>
    2) FOR each encoding symbol, $S_e$,
        2.1) call the MGVM to determine the column index, j, associated with $S_e$.
        2.2) Set column[j].value to $S_e$.
        2.3) Add j to pendingColumns
    3) WHILE pendingColumns is not empty     // back-substitution algorithm
        3.1) Choose j ∈ pendingColumns
        3.2) Remove j from pendingColumns
        3.3) FOR each i in column[j].entries
            3.3.1) set row[i].value to row[i].value $\oplus$ column[j].value
            3.3.2) set (i,j) to zero
            3.3.3) IF (row[i].weight = 1)
                3.3.3.1) Let jj be the value of the single element of row[i].entries
                3.3.3.2) Set column[jj].value to row[i].value
                3.3.3.3) Set (i,jj) to zero
                3.3.3.4) Add jj to pendingColumns -continued 4) IF there exists 1 <= j <= k such that column[j].value = <no value>
        4.1) IF there are no non-empty matrix rows OR this step has been performed before THEN
            4.1.1) report failure and end
        4.2) ELSE     // Gaussian elimination algorithm
            4.2.1) For all i, set row[i].considered to FALSE
            4.2.2) WHILE there exists i such that (row[i].weight > 0) AND (row[i].considered = FALSE)
                4.2.2.1) Choose i such that (row[i].considered = FALSE) AND (row[i].weight is non-zero)
                4.2.2.2) Choose j ∈ row[i]. entries
                4.2.2.3) FOR each ii ∈ column[j].entries with (ii != i) AND (row[ii].considered = FALSE)
                    4.2.2.3.1) set row[ii].value to row[ii].value $\oplus$ row[i].value
                    4.2.2.3.2) FOR each jj ∈ row[i].entries
                          4.2.2.3.2.1) Set (ii,jj) to (ii,jj) $\oplus$ 1
                4.2.2.4) Set row[i].considered to TRUE
                4.2.2.5) IF row[i].weight = 1
                    4.2.2.5.1) Let jj be the value of the single element of row[i].entries
                    4.2.2.5.2) Set column[jj].value to row[i].value
                    4.2.2.5.3) Set (i,jj) to zero
                    4.2.2.5.4) Add jj to pendingColumns
    5) IF pendingColumns is not empty, return to Step 3.
    6) IF there exists 1 <= j <= k such that column[j].value = <no value>
        6.1) Report failure and end
    7) ELSE
        7.1) Report success. Recovered source symbols are in column[j].value for 1<=j <= k
END The above algorithm can be optimised for computational and memory efficiency in the following obvious or well-known ways:

At Step 5, we need not return to step 3 if we have recovered all source symbols

At Step 4.2.2.1 we can choose i such that row[i].weight is minimal

At Step 4.2.2.2 we can choose j such that column[j].weight is minimal. Along with the above bullet, this reduces the addition of new non-zero entries in the matrix.

After Step 3.3, if j>k, then column[j,].value can be discarded so that the memory store can be re-used After steps 3.3.3.2 and 4.2.2.5.2, then row[i].value can be discarded so that the memory store can be re-used Memory for row[i].value need not be allocated until step 3.3.1 is first executed for this row Memory used to store the matrix entries, rows and columns can be freed as those entries are set to zero and rows and columns become empty The back-substitution step can be applied as symbols arrive—i.e. before the code reception overhead has been reached. This will spread the computational load over time. The algorithm may even complete before the code reception overhead is reached. This is because the code reception overhead is usually the overhead required for a given target failure probability, not necessarily a hard lower bound on the number of required symbols.

In case of failure, if additional symbols are available, the algorithm may be continued with these additional symbols For some codes it is only necessary to consider matrix rows which include a received parity symbol. This is the case, for example, for Reed-Solomon codes. Computation can therefore be reduced by modifying the above algorithm as follows:

Steps 3.3.1 to 3.3.3 are only performed if either:
- j>k i.e. if this is a parity symbol, or
- row[i].value has already been initialised i.e. if this row references a received parity symbol At Step 3.3.1, if j>k and row[i].value has not been initialised, then additional processing is performed as follows:
- For each jj ∊ row[i].entries, jj !=j and column[jj].value !=<no value>
  - Set row[i].value to row[i].value ⊕ column[jj].value
  - Set (i, jj) to zero At Step 4.2.1, if row[i].value has not been initialised, then set row[i].considered to TRUE In this way, all computations associated with a given row are delayed until at least one parity symbols has been received for that row. If no such parity symbol is received, then no computations will be performed for that row.

This approach does not work for all codes. In particular codes with parity columns of weight greater than one can benefit from parity symbols which are recovered from the source symbols and then used to recover further source/parity symbols. Therefore this approach should not be used for rows containing parity symbols whose columns have weight greater than one.

A refinement of the above is to apply the above algorithm during the back-substitution stage, but to allow all such rows (i.e. those containing a parity symbol whose column has weight greater than one) to be considered in the Gaussian elimination step. This will reduce unnecessary computation associated with such rows for the case where decoding completes without the Gaussian elimination step.

The algorithm above can easily be modified to provide an encoder for any supported FEC code. The MGVM and MGVM program remain unchanged. The required modifications are as follows:
- The algorithm is passed the set of k source symbols as the initial encoding symbols
- If the code is not systematic, then step 2.1 is not performed and instead the encoding symbols are mapped directly to the first k columns of the matrix
- A new step, 2.4, is required in which the MGVM process routine is called for each parity symbol which is required to be generated. This establishes the mapping between parity symbols and matrix columns, and also allows the MGVM process routine to add any necessary additional matrix rows. This mapping is not used to determine which columns contain the encoded parity symbols.
- Tests for completion at steps (4) and (6) are replaced with tests for column values associated with the columns representing the required parity symbols.
- The optimisation described above in which column value for non-source columns are discarded after step 3.1.1 should not be applied
- The optimisation described above in which rows are not processed until a parity symbol referenced by that row is received should not be applied With the above changes, execution of the algorithm will generate the required parity symbols from the supplied source symbols. As with decoding, the computational workload and memory requirements are dependent on the construction of the code. In the worst case, the algorithm will perform a complete Gaussian elimination on the parity matrix to construct a generator matrix, which is then used with back-substitution to calculate the parity symbols. For other codes, simply substituting the source values into the matrix results in the parity symbols.

An Improved, Adaptive, Decoding Algorithm

As is well known, different techniques are most appropriate for applying Gaussian Elimination to sparse and dense matrices.

In the case of sparse matrices, it is advantageous to choose the lowest weight rows first within the process. It is also advantageous to reduce the weight of each row as far as possible before adding the row to others in the matrix (by calculating the sum of the known symbols corresponding to non-zero entries in the row and then setting these entries to zero).

Furthermore, in the case that the matrix contains more than the minimum number of rows needed to complete the Gaussian elimination process (i.e. more rows than the number of unknown symbols referenced by those rows), some rows will be discarded at the end of the process, having been reduced to zero weight. It is desirable to avoid performing calculations related to these rows before it is known whether the row will eventually be considered or discarded. This can be achieved by performing the row reduction operation described above only when the row is selected as a pivot row by the Gaussian elimination algorithm. Additional reductions in calculations can be achieved by recording for each row the list of rows which have been added to it during the Gaussian elimination process. The associated symbol calculations need not then be performed until the row is selected as a pivot row.

Recording the list of added rows for each row entials a certain storage overhead. It can be observed that where a matrix contains a mixture of sparse and dense rows, it is most likely that the rows which were densest at the start of the process will be the ones discarded at the end of the process. The additional storage required can be reduced by only recording lists of added rows for the densest rows in the matrix. Additionally for rows with density 0.5 or above, each added row will, on average, cause a reduction in the row weight by at least one, freeing storage which could be used to store the entry in the list of added rows.

Lists of added rows should be kept for at least as many rows as the number of surplus rows above the minimum required. The more rows this is done for, the less likely that calculations will be performed for a row which is eventually discarded (and so for which the calculations would be wasted). The number of calculations is always minimised by keeping such lists of added rows for all rows in the matrix.

In the case of dense matrices, then it is more efficient to avoid calculating sums of known symbols until the Gaussian elimination process on the entire matrix is complete. It is therefore advantageous to determine at the outset whether the matrix should be considered sparse/mixed or dense and on this basis to determine whether to perform calculations when pivot rows are selected, or whether to delay all calculations to the end of the process.

Furthermore, storage of lists of added rows can be optimised by determining whether the matrix should be considered sparse or mixed and choosing to keep such lists only for the rows which are densest at the outset.

Determination of whether the matrix is sparse, mixed or dense can be achieved by considering the average row density. If this is high, the matrix should be considered dense. If it is low, then the number of rows with density much higher than the average could be considered to determine whether it should be considered mixed.

It should also be noted that, at the beginning of the Gaussian elimination process, then choosing the lowest weight rows will result in rows of weight one being chosen first (if any exist). The effect is then equivalent to the Belief Propagation algorithm. Therefore, simply executing the Gaussian elimination algorithm to completion twice, in the 'sparse/mixed' mode in which rows are reduced when chosen as pivot rows, will efficiently reduce the matrix into a form in which every row and column contains only a single element. This effectively completes the decoding operation.

The above approach results in an algorithm which adapts automatically to the nature of the matrix with which it is presented, in order to reduce the number of symbol computations. The approach copes efficiently with matrices which are either sparse, dense or which have both sparse and dense regions.

The algorithm can be summarised in the following steps:

Determine whether the matrix is sparse, mixed or dense

Adapting the matrix manipulation according to this determination, by:

If the matrix is mixed/sparse:

During the Gaussian elimination process, when a row is chosen as a pivot row, calculating the sum of those symbols referenced by that row whose value is already known. The symbol so calculated is then added to the symbol associated with each row which has an entry in the chosen pivot column.

Determining if the matrix contains more than the minimum number of rows required to complete Gaussian elimination, if so:

Identifying the densest rows

During the Gaussian elimination process, recording the list of added rows for each of these densest rows and only performing the addition for one of these rows if it is selected as a pivot row If the matrix is dense:

Deferring all symbol calculations until the Gaussian elimination process is completed At each stage, a row of minimum weight may be selected as the pivot row. This step is particularly valuable if the matrix is sparse/mixed.

The algorithm can be combined with simple Belief Propagation executed as symbols arrive as described above.

The decoder algorithm described above could be implemented as part of the decoder or alternatively as part of the bytecode, depending on the design of the virtual machine language as described above.

Although this decoder algorithm is described above in relation to the universal decoder, it is also applicable to other applications which require solving of matrices.

An Example of a Code Based on a Low Density Generator Matrix

An example of a code based on a Low Density Generator Matrix is described below. This is a systematic code in which each source symbol has weight 3 and each parity symbol weight 2.

The algorithm for generating this code is as follows:

Step 1: calculate the number of encoding symbols, N=k/R, where R is the required rate and k is the number of source symbols. The number of parity symbols and of constraints is then M=N−k.

Step 2: choose a random (or random-looking) permutation, s, of the integers 1 . . . E, where E is the number of edges incident on the source symbols, E=3*k.

Step 3: For each i from 1 to E, edge i joins source symbol (i mod k) with constraint (s(i) mod M).

Step 4: For each j from 1 to M-1, parity symbol j is joined to constraint j and j+1. parity symbol M is joint to constraint M.

Note that is it possible that this code contains 2-cycles. Its performance could be improved as follows:

If adding an edge at step 3 causes a 2-cycle, then record the location of this edge (row, column) in a table.

On completion of Step 3, permute the column numbers in the entries of the table constructed above. Attempt to add the resulting edges, removing the successful attempts from the table.

If there are zero or one entries left in the table, then finish. Otherwise apply a new permutation to the remaining entries column values and try again. If there are n>1 remaining entries and all available permutations of the column numbers have been tried, without decreasing the size of the table, then finish.

This may not eliminate all 2-cycles.

An MGVM program which performs Steps 1-4 is shown below:

```
; MGVM program for LDGM 'staircase' matrix with left
degree 3 for source symbols and 2 for parity symbols
;
; Object Information has the following format
; Number of source symbols, 4 octets, k
; Size of source symbols, 4 octets
; Number of parity symbols, 4 octets
; LFSR tap, 4 octets
; LFSR start point, 4 octets
;
; Packet Information format
; Packet number, 4 octets
#define k="0x10"
#define size="0x14"
#define m="0x18"
#define tap="0x1c"
#define myLfsr="0x20"
#define nblocks="0x24"
#define packet="0x28"
#define i="0x00"
#define edges="0x04"
#define row="0x08"
#define column = "0x0c"
#define temp="0x2c"
; first the MGVM program header
    initialise
    process
    0x00000030          ; initialise memory
    0x00000030          ; process memory
    0x0010              ; Object Information address
    0x0014              ; Object Information size
    0x0024              ; Packet Information address
    0x0004              ; Packet Information size
    0x0000              ; Number of extensions
; Now the initialize procedure
initialize:     MULTIPLY edges, k, 3        ; edges = k * 3
                LOAD i, edges
fori:           LOAD row, myLfsr
                DECREMENT row
                MOD row, m          ; row = (myLfsr−1) mod m
                LOAD column, i
                DECREMENT column
                MOD column, k       ; column = (i−1) mod k
                INCREMENT row
                INCREMENT column
                ADDELEMENT row, column
Lfsr:           LFSR myLfsr, tap
                SUBTRACT temp,myl_fsr,edges
                BRN Lfsr
                DECREMENT i
                BRP fori
                INCREMENT k
                LOAD i,1
                ADDIDENTITY i, k, m
                INCREMENT i
                DECREMENT m
                ADDIDENTITY i, k, m
                MULTIPLY m,k,115
                DIVIDE m,100
                LOAD nblocks,1
                EXIT 0x10
process:                    EXIT 0x24
```

It will be apparent that the above described mechanism can be used to implement many well-known forward erasure codes, including, but not limited to:

- Low Density Generator Matrix codes (V. Roca, Z. Khallouf, J. Laboure, "Design and Evaluation of a Low Density Generator Matrix (LDGM) large block FEC codec", Fifth International Workshop on Networked Group Communication (NGC'03), Munich, Germany, September 2003 http://www.inrialpes.fr/planete/people/roca/doc/ngc03_ldpc.pdf)
- Gallager Codes applied to erasure channels (Gallager, R. G., Low Density Parity Check Codes, Monograph, M.I.T. Press, 1963. http://www.inference.phy.cam.ac.uk/mackay/gallager/papers/)
- Tornado Codes (M Luby, M Mitzenmacher, A Shokrollahi, D Spielman, V Stemann, "Practical Loss-resiliant codes", http://www.icsi.berkeley.edu/~luby/PAPERS/losscode.ps)
- LT Codes ("LT codes", Michael Luby, 43rd Annual IEEE Symposium on Foundations of Computer Science, 2002 http://citeseer.nj.nec.com/luby02lt.html)
- Raptor Codes ("Raptor Codes", A Shokrallahi, DF2003-06-001, http://www.digitalfountain.com/technology/researchLibrary/abstract.cfm?u=23)
- XOR-based Reed-Solomon codes ("An XOR-Based Erasure-Resilient Coding Scheme", Johannes Blomer, Malik Kalfane, Richard Karp, Marek Karpinski, Michael Luby and David Zuckerman http://www.icsi.berkeley.edu/~luby/PAPERS/cauchypap.ps).

It will be understood that the above description of preferred embodiments is given by way of example only and that various modifications may be made by those skilled in the art without departing from the spirit and scope of the invention.

The invention claimed is:

1. A decoder arrangement for use in a packet communications system comprising:

- an input for receiving both encoded data and information associated with a coding scheme used to create the encoded data, wherein the information comprises a form other than a mapping;
- a processor for determining, on the basis of the information, a mapping between the encoded data and decoded data; and
- a decoder for extracting data for use in the packet communications system from the encoded data based on the mapping, wherein the decoder is arranged to operate in the same manner independent of the coding scheme used.

2. The decoder arrangement according to claim 1, wherein the information comprises an identifier associated with the coding scheme, and wherein the identifier is one of: a program, an address at which a program can be accessed, and an identifier for a previously received program.

3. The decoder arrangement according to claim 1, wherein the information comprises:

- an identifier associated with the coding scheme;
- information associated with a stream of the encoded data; and
- information associated with each packet within the encoded data.

4. The decoder arrangement according to claim 1, wherein the mapping comprises a matrix representation and the decoder is for solving the matrix representation.

5. The decoder arrangement according to claim 1, wherein the coding scheme is a forward error correction scheme.

6. The decoder arrangement according to claim 5, wherein the forward error correction scheme is a low density parity check erasure code.

7. The decoder arrangement according to claim 1, for use on an erasure channel in the packet communications system.

8. The decoder arrangement according to claim 1, for use in multicast data distribution.

9. The decoder arrangement according to claim 1, wherein the processor is implemented in software.

10. The decoder arrangement according to claim 9, wherein the processor is a Virtual Machine.

11. The decoder arrangement according to claim 2, wherein the identifier is an executable program.

12. A method of decoding data symbols, comprising:

- receiving information associated with a coding scheme used to create the data symbols from a data stream, wherein the information comprises a form other than a mapping;
- receiving the data symbols;
- determining from the information a mapping between the data symbols and the data stream; and
- extracting the data stream from the data symbols according to the mapping, wherein the extracting is independent of the coding scheme.

13. The method of decoding data symbols according to claim 12, wherein the information comprises an identifier associated with the coding scheme and the identifier is one of a program, an address at which a program can be accessed and an identifier for a previously received program.

14. The method of decoding data symbols according to claim 12, wherein the information further comprises an identifier associated with the coding scheme information associated with the data stream, and information associated with each packet within the data stream.

15. The method of decoding data symbols according to claim 12, wherein the mapping comprises a matrix representation and wherein extracting comprises solving the matrix representation.

16. The method of decoding data symbols according to claim 15, wherein the step of solving the matrix representation further comprises determining a density of the matrix representation; and solving the matrix representation using a matrix manipulation technique adapted according to the density determination.

17. The method of decoding data symbols according to claim 16, wherein the matrix manipulation comprises a Gaussian elimination process, and wherein if the density is below a predetermined threshold the Gaussian elimination process comprises:

- calculating a weight of rows within the matrix;
- selecting a row of minimum weight as pivot row;
- selecting a column of minimum weight as pivot column from those columns which have an entry in the selected pivot row and whose value is not known;
- calculating a sum of symbols referenced by the pivot row whose value is already known;
- adding the sum to the symbol associated with each row which has an entry in the selected pivot column; and
- determining if the matrix contains more than a minimum number of rows required to complete Gaussian elimination, and if so, identifying rows of highest density and only performing adding for each of the row of highest density when it is selected as a pivot row; and
- wherein if the density is above a predetermined threshold the Gaussian elimination process comprises performing Gaussian elimination, and deferring symbol calculations until the Gaussian elimination process is complete.

18. The method of decoding data symbols according to claim 12, wherein the information is a computer program, and wherein determining comprises running the program.

19. The method of decoding data symbols according to claim 12, wherein the information comprises an identifier associated with a computer program, and wherein determining comprises running the program.

20. The method of decoding data symbols according to claim 12, wherein the information comprises an address for a program, and wherein determining further comprises: accessing the program at the address, and running the program.

21. A decoder arrangement for use in a packet communications system comprising:

an input for receiving both encoded data and information associated with a forward error correction coding scheme used to create the encoded data, wherein the information comprises a form other than a mapping, and wherein the information comprises at least one of object information and packet information;

a processor for determining on the basis of the information, a mapping between the encoded data and decoded data; and a decoder for extracting data for use in the packet communications system from the encoded data based on the mapping, wherein the decoder is arranged to operate in the same manner independent of the coding scheme used.

22. The decoder arrangement according to claim 21, wherein the information comprises an identifier associated with the coding scheme and wherein the identifier is one of a program, an address at which a program can be accessed and an identifier for a previously received program.

23. The decoder arrangement according to claim 21, wherein the information further comprises:

an identifier associated with the coding scheme.

24. The decoder arrangement according to claim 21, wherein the mapping comprises a matrix representation and the decoder is for solving the matrix representation.

25. The decoder arrangement according to claim 21, wherein the forward error correction scheme is a low density parity check erasure code.

26. The decoder arrangement according to claim 21, for use on an erasure channel in the packet communications system.

27. The decoder arrangement according to claim 21, for use in multicast data distribution.

28. The decoder arrangement according to claim 21, wherein the processor is implemented in software.

29. The decoder arrangement according to claim 28, wherein the processor is a Virtual Machine.

30. The decoder arrangement according to claim 22, wherein the identifier is an executable program.

31. A method of decoding data symbols, comprising:

receiving information associated with a forward error correction coding scheme used to create the data symbols from a data stream, wherein the information comprises a form other than a mapping, rand wherein the information comprises at least one of object information, and packet information;

receiving the data symbols:

determining from the information a mapping between the data symbols and the data stream; and extracting the data stream from the data symbols according to the mapping, wherein extracting is independent of the coding scheme.

32. The method of decoding data symbols according to claim 31, wherein the information comprises an identifier associated with the coding scheme and the identifier is one of a program, an address at which a program can be accessed and an identifier for a previously received program.

33. The method of decoding data symbols according to claim 31, wherein the mapping comprises a matrix representation, and wherein extracting comprises solving the matrix representation.

34. The method of decoding data symbols according to claim 33, wherein solving the matrix representation comprises determining a density of the matrix representation, and solving the matrix representation using a matrix manipulation technique adapted according to the density determination.

35. The method of decoding data symbols according to claim 34, wherein the matrix manipulation comprises a Gaussian elimination process and wherein if the density is below a predetermined threshold the Gaussian elimination process comprises:

calculating a weight of rows within the matrix;

selecting a row of minimum weight as pivot row;

selecting a column of minimum weight as pivot column from those columns which have an entry in the selected pivot row and whose value is not known;

calculating a sum of symbols referenced by the pivot row whose value is already known;

adding the sum to the symbol associated with each row which has an entry in the selected pivot column; and determining if the matrix contains more than a minimum number of rows required to complete Gaussian elimination, and if so, identifying rows of highest density and only performing adding for each of the rows of highest density when it is selected as a pivot row; and wherein if the density is above a predetermined threshold the Gaussian elimination process comprises performing Gaussian elimination, and deferring symbol calculations until the Gaussian elimination process is complete.

36. The method of decoding data symbols according to claim 31, wherein the information is a computer program, and wherein determining further comprises running the program.

37. The method of decoding data symbols according to claim 31, wherein the information comprises an identifier associated with a computer program, and wherein determining comprises running the program.

38. The method of decoding data symbols according to claim 31, wherein the information comprises an address for a program, and the determining step further comprises accessing the program at the address; and running the program.

* * * * *